United States Patent
Suzuki et al.

(10) Patent No.: US 12,105,411 B2
(45) Date of Patent: Oct. 1, 2024

(54) SUBSTRATE WITH MULTILAYER REFLECTIVE FILM, REFLECTIVE MASK BLANK, REFLECTIVE MASK, AND METHOD FOR MANUFACTURING SEMICONDUCTOR DEVICE

(71) Applicant: HOYA CORPORATION, Tokyo (JP)

(72) Inventors: Kota Suzuki, Tokyo (JP); Kayo Chaen, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 455 days.

(21) Appl. No.: 17/626,330

(22) PCT Filed: Aug. 24, 2020

(86) PCT No.: PCT/JP2020/031888
§ 371 (c)(1),
(2) Date: Jan. 11, 2022

(87) PCT Pub. No.: WO2021/044890
PCT Pub. Date: Mar. 11, 2021

(65) Prior Publication Data
US 2022/0269161 A1  Aug. 25, 2022

(30) Foreign Application Priority Data

Sep. 4, 2019  (JP) .................. 2019-161217

(51) Int. Cl.
| G03F 1/24 | (2012.01) |
| G03F 1/38 | (2012.01) |
| G03F 1/48 | (2012.01) |
| G03F 7/20 | (2006.01) |

(52) U.S. Cl.
CPC ............... *G03F 1/24* (2013.01); *G03F 1/38* (2013.01); *G03F 1/48* (2013.01); *G03F 7/20* (2013.01)

(58) Field of Classification Search
CPC ..... G03F 1/24; G03F 1/38; G03F 1/48; G03F 7/20
USPC .......................................................... 430/5
See application file for complete search history.

(56) References Cited

U.S. PATENT DOCUMENTS

| 2005/0250017 A1 | 11/2005 | Mitsui |
| 2007/0031741 A1 | 2/2007 | Kim et al. |
| 2007/0077499 A1 | 4/2007 | Ikuta et al. |
| 2011/0200920 A1 | 8/2011 | Hayashi |
| 2012/0145534 A1 | 6/2012 | Kageyama |
| 2013/0202990 A1 | 8/2013 | Jindal et al. |
| 2013/0323630 A1 | 12/2013 | Maeshige et al. |
| 2015/0010854 A1 | 1/2015 | Seo et al. |
| 2015/0111134 A1 | 4/2015 | Suzuki et al. |

FOREIGN PATENT DOCUMENTS

| CN | 102203906 A | 9/2011 |
| JP | 2006176819 A | 7/2006 |
| JP | 2007041603 A | 2/2007 |
| JP | 2009510711 A | 3/2009 |
| JP | 2010020335 A | 1/2010 |
| JP | 2012129520 A | 7/2012 |
| JP | 2013174012 A | 9/2013 |
| JP | 2013218302 A | 10/2013 |
| JP | 2014095122 A | 5/2014 |
| JP | 2014148706 A | 8/2014 |
| JP | 2017172000 A | 9/2017 |
| JP | 2017182057 A | 10/2017 |
| SG | 10201701374 P | 10/2017 |
| WO | 2010050520 A1 | 5/2010 |
| WO | 2012105698 A1 | 8/2012 |

OTHER PUBLICATIONS

JP2019-161217, "Office Action with Machine Translation", May 9, 2023, 5 pages.
SG11202200377P, "Invitation to Respond to Written Opinion", Feb. 29, 2024, 8 pages.
TW109129900, "Office Action", Feb. 17, 2024, 7 pages.
JP2023-187512, "Notice of Reasons for Refusal" with Machine Translation, Jun. 25, 2024, 5 pages.
PCT/JP2020/031888, English Translation of International Search Report, Oct. 27, 2020, 2 pages.

*Primary Examiner* — Christopher G Young
(74) *Attorney, Agent, or Firm* — Kilpatrick Townsend & Stockton LLP

(57) ABSTRACT

Provided is a substrate with a thin film for manufacturing a reflective mask that at least does not adversely affect performance of the reflective mask even when a thin film of a substrate with the thin film such as a reflective mask blank comprises impurities.
A substrate with a thin film comprises: a substrate; and at least one thin film formed on a main surface of the substrate. The thin film comprises a matrix material constituting the thin film and a small-amount material other than the matrix material. When secondary ion intensity emitted from the thin film is measured by time-of-flight secondary ion mass spectrometry (TOF-SIMS), a ratio ($I_2/I_1$) of secondary ion intensity ($I_2$) of at least one of the small-amount material in the thin film to secondary ion intensity ($I_1$) of the matrix material is more than 0 and 0.300 or less.

14 Claims, 4 Drawing Sheets

SUBSTRATE WITH MULTILAYER REFLECTIVE FILM, REFLECTIVE MASK BLANK, REFLECTIVE MASK, AND METHOD FOR MANUFACTURING SEMICONDUCTOR DEVICE

CROSS-REFERENCE TO RELATED APPLICATIONS

The present application is the National Stage of International Application No. PCT/JP2020/031888, filed on Aug. 24, 2020, which claims priority to Japanese Patent Application No. 2019-161217, filed on Sep. 4, 2019, and the contents of which is incorporated by reference.

TECHNICAL FIELD

The present disclosure relates to a reflective mask used for manufacturing a semiconductor device and the like, and a substrate with a multilayer reflective film and a reflective mask blank used for manufacturing the reflective mask. The present disclosure also relates to a method for manufacturing a semiconductor device using the above reflective mask.

BACKGROUND ART

In recent years, in a semiconductor industry, along with high integration of a semiconductor device, a fine pattern exceeding a transfer limit of a conventional photolithography method using ultraviolet light has been required. In order to make such fine pattern formation possible, EUV lithography, which is an exposure technique using extreme ultraviolet (hereinafter, referred to as "EUV") light, is promising. Here, the EUV light refers to light in a wavelength band of a soft X-ray region or a vacuum ultraviolet region, and specifically refers to light having a wavelength of about 0.2 to 100 nm. A reflective mask has been proposed as a transfer mask used in EUV lithography. The reflective mask includes a multilayer reflective film for reflecting exposure light formed on a substrate, and an absorber film pattern which is a patterned absorber film formed on the multilayer reflective film for absorbing exposure light.

The reflective mask is manufactured from a reflective mask blank including a substrate, a multilayer reflective film formed on the substrate, and an absorber film formed on the multilayer reflective film. The absorber film pattern is manufactured by forming a pattern of an absorber film by a photolithography method or the like.

A substrate with a multilayer reflective film for manufacturing the reflective mask blank is required to have higher smoothness from a viewpoint of improvement in defect quality due to miniaturization of a pattern in recent years and optical characteristics required for a transfer mask. The multilayer reflective film is formed by alternately building up a high refractive index layer and a low refractive index layer on a surface of a mask blank substrate. The high refractive index layer and the low refractive index layer are generally formed by a sputtering method such as ion beam sputtering.

As a technique for manufacturing the substrate with a multilayer reflective film, Patent Document 1 describes that when a multilayer reflective film of a reflective mask blank for EUV lithography is formed on a substrate, ion beam sputtering is performed while the substrate is rotated about a central axis thereof and an absolute value of an angle $\alpha$ formed by a normal line of the substrate and sputtered particles incident on the substrate is maintained at 35 degrees $\leq \alpha \leq 80$ degrees.

Patent Document 2 describes a method for coating a deposition chamber shield of a deposition chamber for depositing a substance on a substrate. Specifically, Patent Document 2 describes a method including: step a) of providing a deposition shield having a prepared surface; step b) of coating the prepared shield surface with a stainless steel coating having a thickness of about 100 μm to about 250 μm; and step c) of cleaning the coated surface to remove loose particles, thus providing a shield coated with stainless steel having a surface roughness of about 300 μin to about 800 μin and a surface particle density of less than about 0.1 particles/ $mm^2$ for particles having a size of about 1 μm to about 5 μm and including no particles having a size of less than about 1 μm.

Patent Document 3 describes a method for manufacturing a substrate with a reflection layer for EUV lithography (EUVL). Specifically, the manufacturing method described in Patent Document 3 includes: a step of forming a Mo/Si multilayer reflective film by alternately forming a molybdenum (Mo) film and a silicon (Si) film on a substrate; and a step of forming a ruthenium (Ru) film or a Ru compound film as a protective layer on the multilayer reflective film. Patent Document 3 further describes that an erosion region and a non-erosion region of a sputtering target (a Ru target or a Ru compound target) used for forming the Ru film or the Ru compound film are predicted based on an erosion region of a sputtering target (Si target) used for forming the Si film, the predicted non-erosion region of the Ru target or the Ru compound target is subjected to roughening treatment, and then the Ru film or the Ru compound film is formed.

Patent Document 1: JP 2009-510711 A
Patent Document 2: JP 2013-174012 A
Patent Document 3: JP 2012-129520 A

DISCLOSURE OF INVENTION

A reflective mask includes at least a substrate, a multilayer reflective film for reflecting exposure light, and an absorber pattern for absorbing exposure light. The reflective mask is manufactured by patterning an absorber film of a reflective mask blank to form an absorber pattern. The reflective mask blank includes a substrate, a multilayer reflective film, and an absorber film, and may further include a thin film such as a conductive back film, a protective film, or an etching mask film as necessary. Note that a substrate in which at least one thin film selected from a multilayer reflective film, an absorber film, a conductive back film, a protective film, an etching mask film, and the like is formed on a main surface of the substrate is referred to as a substrate with a thin film.

In order to form a thin film such as a multilayer reflective film on a main surface of a substrate, a sputtering method is generally used. A film forming apparatus used in the sputtering method is a vacuum film forming apparatus. That is, film formation by the sputtering method is performed in a vacuum chamber the inside of which is in a vacuum state. In the vacuum film forming apparatus, it is inevitable that a film is attached to a portion other than a substrate in the vacuum chamber. When a film attached to a portion other than the substrate is peeled off and attached to the substrate, a defect is caused. In order to prevent occurrence of a defect in a formed thin film due to peeling of the attached film, a shield can be disposed in the vacuum chamber. In order to prevent a film attached to a surface of the shield from being peeled off, for example, a surface of the shield is blasted, or a sprayed coating film is formed on the surface of the shield. As a material of particles for blasting and a material of the sprayed coating film, materials such as alumina, titania, and yttria are often selected.

Meanwhile, although the surface of the shield is treated as described above, the thin film formed on the substrate may contain a material (small-amount material) derived from a material inside the chamber such as the shield. A reason for this is considered to be that a constituent member such as the shield is exposed to plasma, an ion beam, and the like when a thin film is formed. The content of the small-amount material contained in the thin film is ideally preferably zero. However, for the above reason, it is very difficult to reduce the content of the small-amount material derived from a material inside the chamber of the vacuum film forming apparatus in the thin film to zero in view of cost and production efficiency. Impurities contained in the thin film may affect the characteristics of a reflective mask blank and a reflective mask, an EUV reflectance of a multilayer reflective film or the like, occurrence of defects during etching, durability of the reflective mask, and the like depending on the type of a substance.

Note that also when a thin film is formed using a film forming method other than the sputtering method, as described above, it is conceivable that a small amount of impurities derived from a material constituting a vacuum chamber are mixed into thin films of a reflective mask blank and a reflective mask.

Therefore, an aspect of the present disclosure is to provide a reflective mask that at least does not adversely affect performance of the reflective mask even when thin films of a reflective mask blank and the reflective mask contain impurities. Another aspect of the present disclosure is to provide a substrate with a thin film such as a reflective mask blank for manufacturing the reflective mask. Still another aspect of the present disclosure is to provide a method of manufacturing a semiconductor device using the reflective mask.

In order to solve the above problems, the present disclosure has the following configurations.

(Configuration 1)

Configuration 1 of the present disclosure is a substrate with a thin film comprising: a substrate; and at least one thin film formed on a main surface of the substrate, in which
- the thin film comprises a matrix material constituting the thin film and a small-amount material other than the matrix material, and
- when secondary ion intensity emitted from the thin film is measured by time-of-flight secondary ion mass spectrometry (TOF-SIMS), a ratio ($I_2/I_1$) of secondary ion intensity ($I_2$) of at least one of the small-amount material in the thin film to secondary ion intensity ($I_1$) of the matrix material is more than 0 and 0.300 or less.

(Configuration 2)

Configuration 2 of the present disclosure is the substrate with a thin film according to Configuration 1, in which the small-amount material comprises at least one element selected from yttrium (Y), zirconium (Zr), niobium (Nb), aluminum (Al), titanium (Ti), chromium (Cr), iron (Fe), nickel (Ni), and copper (Cu).

(Configuration 3)

Configuration 3 of the present disclosure is the substrate with a thin film according to Configuration 1 or 2, in which the thin film is at least one selected from a conductive back film, a multilayer reflective film, a protective film, an absorber film, and an etching mask film.

(Configuration 4)

Configuration 4 of the present disclosure is the substrate with a thin film according to Configuration 3, in which the thin film is a multilayer reflective film, and the matrix material is molybdenum (Mo).

(Configuration 5)

Configuration 5 of the present disclosure is the substrate with a thin film according to Configuration 3, in which the thin film is a protective film, and the matrix material is ruthenium (Ru).

(Configuration 6)

Configuration 6 of the present disclosure is a reflective mask blank comprising an absorber film on the substrate with a thin film according to any one of Configurations 1 to 5, in which the thin film is at least one selected from a multilayer reflective film and a protective film.

(Configuration 7)

Configuration 7 of the present disclosure is a reflective mask having an absorber pattern in which the absorber film in the reflective mask blank according to Configuration 6 is patterned.

(Configuration 8)

Configuration 8 of the present disclosure is a method for manufacturing a semiconductor device, the method comprising setting the reflective mask according to Configuration 7 in an exposure apparatus having an exposure light source that emits EUV light and transferring a transfer pattern to a resist film formed on a transfer target substrate.

The present disclosure can provide a reflective mask that at least does not adversely affect performance of the reflective mask even when a thin film of the reflective mask contains impurities. In addition, the present disclosure can provide a substrate with a thin film such as a reflective mask blank for manufacturing the reflective mask. Furthermore, the present disclosure can provide a method for manufacturing a semiconductor device using the reflective mask.

DESCRIPTION OF EMBODIMENTS

Hereinafter, an embodiment of the present disclosure will be specifically described with reference to the drawings.

Note that the following embodiment is a mode for specifically describing the present disclosure and does not limit the present disclosure within the scope thereof.

The present embodiment is a substrate with a thin film including the thin film on at least one of two main surfaces of a mask blank substrate (also simply referred to as a "substrate"). The thin film included in the substrate with a thin film of the present embodiment contains a predetermined material (a matrix material and a small-amount material) as described below. In the present specification, the thin film containing a predetermined material used in the present embodiment may be referred to as a "predetermined thin film".

Figure 1:
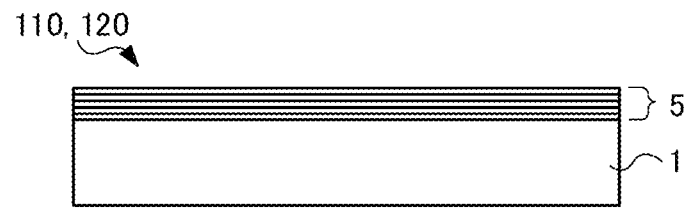
FIG. 1 is a schematic cross-sectional view of an example of a substrate with a multilayer reflective film (substrate with a thin film) of a present embodiment.

FIG. 1 is a schematic view illustrating an example of a substrate with a multilayer reflective film 110 which is an example of a substrate with a thin film 120 of the present embodiment. The substrate with a multilayer reflective film 110 illustrated in FIG. 1 includes a multilayer reflective film 5. In the example illustrated in FIG. 1, the multilayer reflective film 5 of the substrate with a multilayer reflective film 110 is the predetermined thin film.

Figure 2:
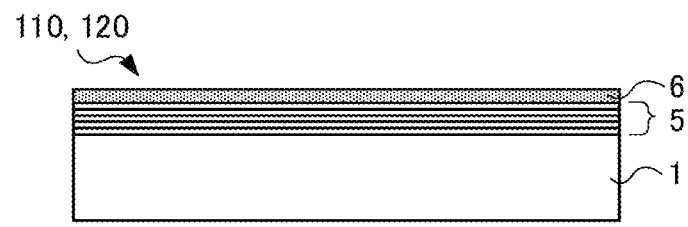
FIG. 2 is a schematic cross-sectional view of another example of the substrate with a multilayer reflective film (substrate with a thin film) of the present embodiment.

FIG. 2 is a schematic view illustrating an example of the substrate with a multilayer reflective film 110 which is another example of the substrate with a thin film 120 of the present embodiment. The substrate with a multilayer reflective film 110 illustrated in FIG. 2 includes the multilayer reflective film 5 and a protective film 6. In the example illustrated in FIG. 1, the multilayer reflective film 5 and/or the protective film 6 of the substrate with a multilayer reflective film 110 is the predetermined thin film.

Figure 3:
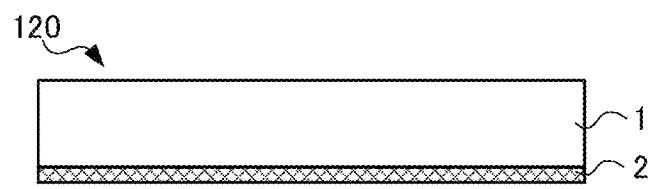
FIG. 3 is a schematic cross-sectional view of an example of a substrate with a conductive back film (substrate with a thin film) of the present embodiment.

FIG. 3 is a schematic view illustrating an example of the substrate with a thin film 120 (substrate with a conductive back film) of the present embodiment. The substrate with a thin film 120 illustrated in FIG. 3 includes a conductive back film 2. In the example illustrated in FIG. 3, the conductive back film 2 of the substrate with a thin film 120 is the predetermined thin film.

Figure 4:
FIG. 4 is a schematic cross-sectional view of still another example of the substrate with a multilayer reflective film (substrate with a thin film) of the present embodiment.

FIG. 4 is a schematic view illustrating still another example of the substrate with a multilayer reflective film 110 which is another example of the substrate with a thin film 120 of the present embodiment. The substrate with a multilayer reflective film 110 illustrated in FIG. 4 includes the conductive back film 2, the multilayer reflective film 5, and the protective film 6. In the example illustrated in FIG. 4, at least one of the conductive back film 2, the multilayer reflective film 5, and the protective film 6 is the predetermined thin film.

Figure 5:
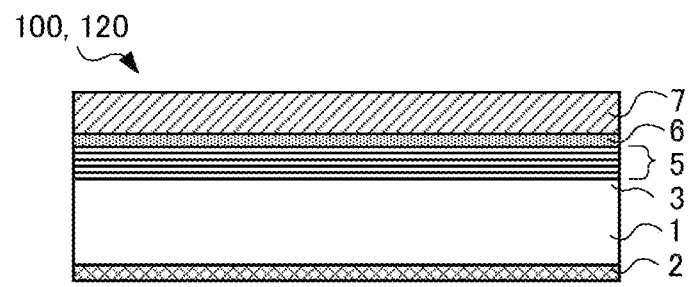
FIG. 5 is a schematic cross-sectional view of an example of a reflective mask blank (substrate with a thin film) of the present embodiment.

FIG. 5 is a schematic view illustrating an example of the reflective mask blank 100 which is an example of the substrate with a thin film 120 of the present embodiment. The reflective mask blank 100 illustrated in FIG. 5 includes the conductive back film 2, the multilayer reflective film 5, the protective film 6, and an absorber film 7. In the example illustrated in FIG. 5, at least one of the conductive back film 2, the multilayer reflective film 5, the protective film 6, and the absorber film 7 is the predetermined thin film.

Figure 6:
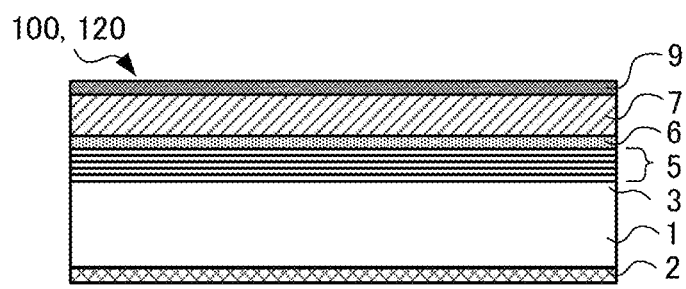
FIG. 6 is a schematic cross-sectional view of another example of the reflective mask blank (substrate with a thin film) of the present embodiment.

FIG. 6 is a schematic view illustrating another example of the reflective mask blank 100 which is an example of the substrate with a thin film 120 of the present embodiment. The reflective mask blank 100 illustrated in FIG. 6 includes the conductive back film 2, the multilayer reflective film 5, the protective film 6, the absorber film 7, and an etching mask film 9. In the example illustrated in FIG. 6, at least one of the conductive back film 2, the multilayer reflective film 5, the protective film 6, the absorber film 7, and the etching mask film 9 is the predetermined thin film.

In the present specification, the "substrate with a multilayer reflective film 110" refers to one in which the multilayer reflective film 5 is formed on a predetermined substrate 1. FIGS. 1 and 2 each illustrate an example of a schematic cross-sectional view of the substrate with a multilayer reflective film 110. Note that the "substrate with a multilayer reflective film 110" includes one in which a thin film other than the multilayer reflective film 5, for example, the protective film 6 and/or the conductive back film 2 is formed.

In the present specification, the "reflective mask blank 100" refers to one in which the absorber film 7 is formed on the multilayer reflective film 5 of the substrate with a multilayer reflective film 110. Note that the "reflective mask blank 100" includes a structure in which a thin film such as the etching mask film 9 or a resist film 8 is further formed (see FIGS. 6 and 7B).

In the present specification, out of main surfaces of the mask blank substrate 1, a main surface on which the conductive back film 2 is formed may be referred to as a "back main surface" or a "second main surface". In addition, in the present specification, a main surface of the substrate with a conductive back film on which the conductive back film 2 is not formed may be referred to as a "front main surface" (or a "first main surface"). On the front main surface of the mask blank substrate 1, the multilayer reflective film 5 in which a high refractive index layer and a low refractive index layer are alternately layered is formed.

In the present specification, the phrase "the mask blank substrate 1 includes (has) the predetermined thin film on a main surface thereof" means that the predetermined thin film is formed in contact with the main surface of the mask blank substrate 1, and also means that there is another film between the mask blank substrate 1 and the predetermined thin film. The same applies to a film other than the predetermined thin film. For example, the phrase "having a film B on a film A" means that the film A and the film B are formed so as to be in direct contact with each other, and also means that there is another film between the film A and the film B. In addition, in the present specification, for example, the phrase "the film A is formed in contact with a surface of the film B" means that the film A and the film B are formed in direct contact with each other without another film interposed between the film A and the film B.

Next, surface roughness (Rms), which is a parameter indicating a surface state of the mask blank substrate 1 and a surface state of a surface of a thin film constituting the reflective mask blank 100 or the like, will be described.

Root means square (Rms), which is a representative index of surface roughness, is root mean square roughness and a square root of a value obtained by averaging squares of deviations from a mean line to a measurement curve. Rms is expressed by the following formula (1).

[Mathematical formula 1]

$$\text{Rms} = \sqrt{\frac{1}{l}\int_0^l Z^2(x)dx} \quad (1)$$

In formula (1), l represents a reference length, and Z represents a height from a mean line to a measurement curve.

Rms is conventionally used to manage surface roughness of the mask blank substrate 1, and the surface roughness can be grasped by a numerical value.

[Substrate with Thin Film 120]

Next, the substrate with a thin film 120 of the present embodiment and the predetermined thin film will be described. The substrate with a thin film 120 of the present embodiment includes the predetermined thin film on at least one of two main surfaces of the substrate 1.

FIGS. 1 to 6 each illustrate an example of the substrate with a thin film 120 of the present embodiment. As described above, the substrate with a thin film 120 illustrated in each of FIGS. 1 and 2 is also referred to as the substrate with a multilayer reflective film 110. In addition, the substrate with a thin film 120 illustrated in FIG. 3 is also referred to as a substrate with a conductive back film. In addition, the substrate with a thin film 120 illustrated in each of FIGS. 5 and 6 is also referred to as the reflective mask blank 100.

In the substrate with a thin film 120 of the present embodiment, any one of any thin films formed on the substrate with a thin film 120 is the predetermined thin film. The predetermined thin film is preferably at least one selected from the conductive back film 2, the multilayer reflective film 5, the protective film 6, the absorber film 7, and the etching mask film 9. In addition, the predetermined thin film is more preferably the multilayer reflective film 5 and/or the protective film 6. In the present embodiment, since the predetermined thin film is a thin film (a thin film such as the multilayer reflective film 5 or the protective film 6) usually used in forming the reflective mask blank 100, it is possible to manufacture the reflective mask 200 that does not adversely affect performance of the reflective mask 200.

[Predetermined Thin Film]

Next, the predetermined thin film of the substrate with a thin film 120 of the present embodiment will be described. The predetermined thin film included in the substrate with a thin film 120 of the present embodiment includes a matrix material constituting the thin film and a small-amount material other than the matrix material.

In the present specification, the "matrix material" is a main material among materials forming the thin film, and is a material corresponding to the highest signal intensity when the thin film is measured by time-of-flight secondary ion mass spectrometry (TOF-SIMS). Note that the signal intensity of TOF-SIMS is not necessarily proportional to the content in the thin film measured by another analysis method. For example, in a case of the Mo/Si multilayer reflective film 5 including a Mo layer and a Si layer, atomic ratios of Mo and Si are about 40 atomic % and 60 atomic %, respectively, in measurement by X-ray photoelectron spectroscopy (XPS). However, when the Mo/Si multilayer reflective film 5 is measured by TOF-SIMS under measurement conditions described later, the signal intensity of Mo is detected to be higher than the signal intensity of Si. Therefore, the matrix material of the Mo/Si multilayer reflective film 5 in the present embodiment is Mo. Note that the matrix material as described above may be referred to as a "matrix material constituting the thin film".

In the present specification, the "small-amount material" is a material other than the matrix material contained in the thin film. More specifically, the small-amount material can mean a material (element) other than the matrix material, in which the content of the small-amount material in the thin film is 3 atomic % or less in measurement by XPS. For example, in a case of the Mo/Si multilayer reflective film 5, an atomic ratio of Si is about 60 atomic %, which can mean that Si is neither the matrix material nor the small-amount material.

Conventionally, it has been considered that impurities contained in a thin film adversely affect performance of the thin film. Therefore, efforts have been made such that the concentration of impurities contained in the thin film is as low as possible (ideally zero). The present inventors have found that when the content of the small-amount material (impurities) contained in the thin film of the substrate with a thin film 120 is equal to or lower than a predetermined range, performance of the reflective mask 200 manufactured using the substrate with a thin film 120 is not adversely affected. In addition, the present inventors have found that when the small-amount material (impurities) contained in the thin film of the substrate with a thin film 120 is a predetermined material and the content of the small-amount material is equal to or less than a predetermined range, even if the small-amount material (impurities) is present in the thin film, performance of the reflective mask 200 is not adversely affected, or the performance of the reflective mask 200 can be improved by the presence of the small-amount material (impurities) in the thin film. In the present specification, impurities that do not adversely affect the reflective mask 200 even if the impurities are present in the thin film, or can improve the performance of the reflective mask 200 by the presence thereof can be referred to as the small-amount material. The content of the small-amount material is often extremely small, and needs to be measured by a highly sensitive measurement method. Specifically, the content of the small-amount material can be determined by time-of-flight secondary ion mass spectrometry (TOF-SIMS) described next.

In the present embodiment, in order to evaluate the content of the small-amount material with respect to the content of the matrix material of the predetermined thin film of the substrate with a thin film 120, the content of the small-amount material can be measured using time-of-flight secondary ion mass spectrometry (TOF-SIMS). Specifically, by measuring secondary ion intensity emitted from the thin film by TOF-SIMS, a ratio ($I_2/I_1$) of secondary ion intensity ($I_2$) of at least one small-amount material in the thin film to secondary ion intensity ($I_1$) of the matrix material can be obtained. In the present embodiment, the secondary ion intensity ratio ($I_2/I_1$) of the predetermined thin film is preferably more than 0, and more preferably 0.005 or more. In addition, the ratio ($I_2/I_1$) is preferably 0.300 or less, more preferably 0.250 or less, and still more preferably 0.200 or less.

Measurement conditions by time-of-flight secondary ion mass spectrometry (TOF-SIMS) for measuring secondary ion intensity ($I_1$) of the matrix material of the predetermined thin film and secondary ion intensity ($I_2$) of at least one small-amount material can be set as follows.

Primary ion species: $Bi_3^{++}$
Primary acceleration voltage: 30 kV
Primary ion current: 3.0 nA
Primary ion irradiation region: square inner region of 200 μm on each side
Secondary ion measurement range: 0.5 to 3000 m/z Here, when the predetermined thin film to be measured is measured by TOF-SIMS, by ion-etching a surface of the predetermined thin film by 1 to 2 nm, the secondary ion intensity can be measured. Meanwhile, when another film is layered on the predetermined thin film to be measured, by removing the other film by ion etching to expose the predetermined thin film, the secondary ion intensity of the predetermined thin film can be measured.

Note that the content of the small-amount material in the predetermined thin film is often extremely small. Therefore, the secondary ion intensity obtained by TOF-SIMS tends to vary depending on measurement conditions. When the secondary ion intensity ratio ($I_2/I_1$) obtained by TOF-SIMS is used, variations due to measurement conditions can be suppressed. Therefore, by using the secondary ion intensity ratio ($I_2/I_1$) obtained by TOF-SIMS, the content of the small-amount material in the thin film that does not adversely affect the performance of the reflective mask 200 or can improve the performance of the reflective mask 200 can be appropriately defined.

Note that, in general, a lower limit of the content of the small-amount material (impurities) in the predetermined thin film is ideally preferably zero. However, in practice, when the predetermined thin film is formed by a sputtering method or the like, constituent members inside a film forming chamber such as a shield are exposed to plasma, an ion beam, or the like. Therefore, it is very difficult to reduce the content of the small-amount material derived from a material inside the chamber in the predetermined thin film to zero in view of cost and production efficiency. Therefore, in the present embodiment, a predetermined small-amount material is contained to such an extent that the small-amount material does not adversely affect the reflective mask 200 even if the small-amount material is present in the thin film or can improve the performance of the reflective mask 200 by the presence thereof, and a lower limit of the secondary ion intensity ratio ($I_2/I_1$) is set to a value more than 0.

In addition, when the secondary ion intensity ratio ($I_2/I_1$) is more than 0.300, defects of the substrate with a thin film 120 may increase, and may adversely affect the performance of the substrate with a thin film 120. For example, when the predetermined thin film is a multilayer reflective film and/or a protective film and the secondary ion intensity ratio ($I_2/I_1$) is more than 0.300, a reflectance of EUV light may decrease, which is not preferable.

The small-amount material of the predetermined thin film of the substrate with a thin film 120 of the present embodiment preferably contains at least one element selected from yttrium (Y), zirconium (Zr), niobium (Nb), aluminum (Al), titanium (Ti), chromium (Cr), iron (Fe), nickel (Ni), and copper (Cu).

Extinction coefficients k of yttrium (Y), zirconium (Zr), and niobium (Nb) at a wavelength of 13.5 nm are relatively low. Therefore, when these small-amount materials are contained, for example, in the multilayer reflective film 5 and/or the protective film 6, an influence on the reflectance of the multilayer reflective film 5 with respect to EUV light is small. In addition, inclusion of these small-amount materials in the predetermined thin film may contribute to improvement in durability of the predetermined thin film. In particular, when the small-amount material is yttrium (Y), etching resistance of the predetermined thin film is increased, which is preferable. Note that when a material having a low extinction coefficient k such as Y, Zr, or Nb is used as the small-amount material, the extinction coefficient k of the small-amount material is preferably less than 0.01, and more preferably 0.005 or less.

In addition, the extinction coefficients k of aluminum (Al), titanium (Ti), chromium (Cr), iron (Fe), nickel (Ni), and copper (Cu) at a wavelength of 13.5 nm are relatively high. However, when the content of the small-amount material contained in the predetermined thin film is a small amount (the secondary ion intensity ratio ($I_2/I_1$) is equal to or less than a predetermined value) as described above, an influence on the reflectance of the reflective mask 200 with respect to EUV light is small. In addition, inclusion of these small-amount materials may reduce a stress difference at an interface between the predetermined thin film and another thin film or the like. In addition, when these small-amount materials are contained, crystallization of the predetermined thin film tends to be inhibited. Therefore, when the predetermined thin film contains these small-amount materials, the crystal structure of the predetermined thin film can be easily made amorphous. By making the crystal structure amorphous, surface roughness of the predetermined thin film can be reduced. Note that when a material having a high extinction coefficient k such as Al, Ti, Cr, Fe, Ni, or Cu is used as the small-amount material, the extinction coefficient k of the small-amount material is preferably 0.01 or more.

Figure 8:
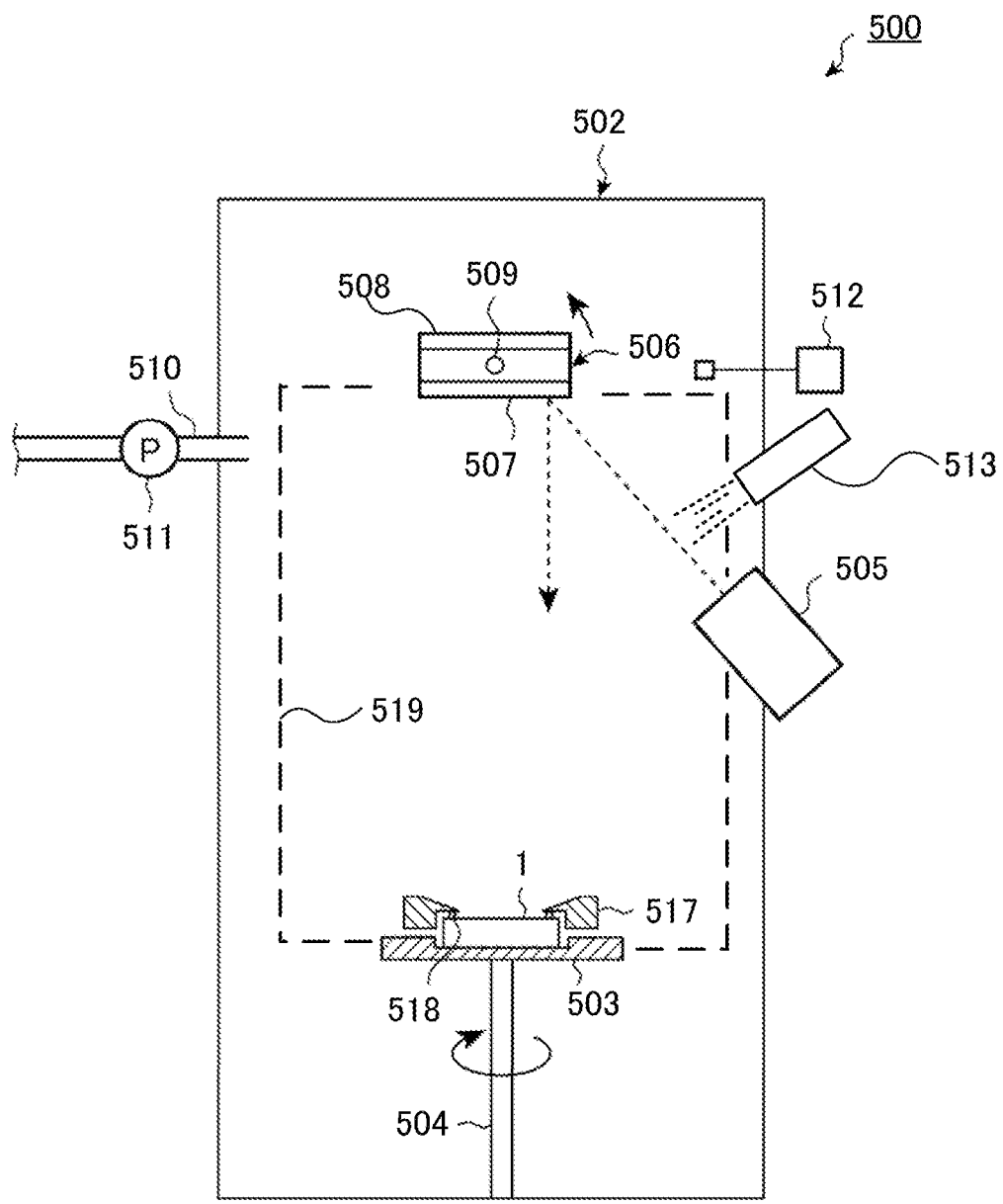
FIG. 8 is a schematic diagram of an internal structure of an ion beam sputtering apparatus.

For forming the predetermined thin film of the substrate with a thin film 120 of the present embodiment, an ion beam sputtering method, a magnetron sputtering method such as a DC sputtering method or an RF sputtering method, and the like can be used. FIG. 8 illustrates an example of a schematic diagram of an internal structure of an ion beam sputtering apparatus 500. An example of the ion beam sputtering apparatus 500 that can be used for forming the predetermined thin film of the present embodiment will be described with reference to FIG. 8.

As illustrated in the schematic diagram of FIG. 8, the ion beam sputtering apparatus 500 that can be used in the present embodiment includes a substantially rectangular vacuum chamber 502. On one short surface of the vacuum chamber 502 (a wall surface having a lower side in FIG. 8 as one side, hereinafter, for convenience of description, appropriately referred to as a "lower short surface"), a substrate holder 503 is disposed via a holder attaching rod 504. The substrate holder 503 is rotatable while holding the substrate 1 described later in detail. In addition, the substrate holder 503 includes a top clamp 517 having a holding pin 518 at a corner portion thereof. The substrate 1 is disposed on the substrate holder 503. The substrate 1 is clamped by holding a corner of a main surface of the substrate 1 with the holding pin 518 of the top clamp 517. The top clamp 517 has a function of holding the substrate 1 together with the substrate holder 503. Furthermore, the top clamp 517 has a function of suppressing film attachment to a side surface of the substrate 1 (a function similar to that of a shield 519 described later). A material of the top clamp 517 is preferably an insulating material, for example, a resin material, from a viewpoint of suppressing dust generation by pressing the substrate 1. Furthermore, among resins, a material having a relatively high hardness is preferable, and for example, a polyimide-based resin is particularly preferable.

In addition, around the other short surface of the vacuum chamber 502 (a wall surface having an upper side in FIG. 8 as one side, hereinafter, appropriately referred to as an "upper short surface"), a base 506 having a substantially rectangular shape in plan view is disposed so as to face the substrate holder 503. On one long side of the base 506 (a surface including one long side), a first sputtering target 507 is disposed. On the other long side of the base 506 (a surface including the other long side), a second sputtering target 508 is disposed. As a material constituting each of the first sputtering target 507 and the second sputtering target 508, a metal, an alloy, a non-metal, or a compound thereof can be used in order to form the predetermined thin film in the mask blank. Note that when only one type of thin film is formed, only one of the first sputtering target 507 and the second sputtering target 508 can be used.

Using the ion beam sputtering apparatus 500, for example, the multilayer reflective film 5 in which a high refractive index material and a low refractive index material are alternately layered can be formed as the predetermined thin film. In this case, as a material constituting the first sputtering target 507, a high refractive index material such as silicon (Si) can be used. In addition, as a material constituting the second sputtering target 508, a low refractive index material such as molybdenum (Mo) can be used. Here, the ion beam sputtering apparatus 500 will be described by exemplifying a case where a Si material is used for the first sputtering target 507 and a Mo material is used for the second sputtering target 508. In addition, since a rotation shaft 509 is disposed at a center of the base 506, the base 506 can rotate integrally with the rotation shaft 509.

To one longitudinal surface of the vacuum chamber 502 (a wall surface having a left side in FIG. 8 as one side, hereinafter, appropriately referred to as a "left longitudinal surface"), an exhaust passage 510 including a vacuum pump 511 is connected. In addition, in the exhaust passage 510, a valve (not illustrated) is disposed so as to be freely opened and closed.

On the other longitudinal surface of the vacuum chamber 502 (a wall surface having a right side in FIG. 8 as one side, hereinafter, appropriately referred to as a "right longitudinal surface"), a pressure sensor 512 for measuring pressure in the vacuum chamber 502 and an ion source 505 for supplying ionized particles are disposed. The ion source 505 is connected to a plasma gas supply unit (not illustrated). Ion particles of a plasma gas are supplied from the plasma gas supply unit. When the multilayer reflective film 5 is a Mo/Si periodic multilayer film, inert gas ion particles such as argon ions, krypton ions, or xenon ions can be used as the ion particles. In addition, the ion source 505 is disposed so as to face the base 506. The ion source 505 supplies the ion particles supplied from the plasma gas supply unit to either the sputtering target 507 or 508 of the base 506.

In addition, a neutralizer 513 is disposed in order to supply electrons for neutralizing the ion particles from the ion source 505. The neutralizer 513 includes an electron supply source (not illustrated) that supplies electrons by extracting electrons from a plasma of a predetermined gas. The electron supply source emits electrons toward a path of ion particles travelling from the ion source 505 toward the sputtering target 507 or 508. Note that not all the ion particles are necessarily neutralized by the neutralizer 513. Therefore, in the present specification, the term "ion particles" is also used for ion particles partially neutralized by the neutralizer 513.

Devices such as the holder attaching rod 504, the ion source 505, the rotation shaft 509, the vacuum pump 511, and the pressure sensor 512 are connected to a control device (not illustrated) such that operation is controlled by the control device.

As schematically illustrated in FIG. 8, the shield 519 is disposed in the vacuum chamber 502. Together with the above-described top clamp 517, the shield 519 is disposed in order to prevent occurrence of defects in a thin film formed on the substrate 1 due to peeling of an attached film. When the predetermined thin film is formed, a surface of the shield 519 is exposed to a beam of ionized particles or the like. Therefore, a substance on the surface of the shield 519 is released, and a part thereof is contained in the thin film. By disposing a predetermined substance on the surface of the shield 519, the predetermined substance can be contained in the predetermined thin film as a predetermined small-amount material. The shield 519 can be disposed in a portion exposed to a beam of ionized particles or the like. Therefore, by disposing a substance corresponding to the predetermined small-amount material on the surface of the shield 519, the predetermined small-amount material can be contained in the predetermined thin film. In addition, for a constituent member other than the shield 519 disposed in the vacuum chamber 502, similarly to the shield 519, there is a possibility that a substance on a surface of the constituent member is released and contained in the predetermined thin film. By covering most of a region of the vacuum chamber 502 for film formation with the shield 519, it is possible to avoid an influence of a constituent member other than the shield 519. Therefore, by controlling the predetermined small-amount material disposed on the surface of the shield 519, the type and content of the small-amount material contained in the predetermined thin film can be controlled.

In order to dispose a substance corresponding to the predetermined small-amount material on the surface of the shield 519, the shield 519 can be made of a material containing the substance corresponding to the predetermined small-amount material. In addition, by spraying the substance corresponding to the small-amount material on the surface of the shield 519, a coating film containing the small-amount material can be formed. For example, as the shield 519 made of a material containing yttrium (Y), it is possible to use the shield 519 in which a coating film of yttria ($Y_2O_3$) is formed on the surface of the shield 519 or the like by spraying yttria ($Y_2O_3$) on the surface of the shield 519 made of a stainless steel material suitable for a vacuum container, such as SUS 314 or SUS 316. In addition, by subjecting the surface of the shield 519 to blast treatment with a predetermined blasting material containing the small-amount material, the substance corresponding to the predetermined small-amount material can be disposed on the surface of the shield 519. For example, by subjecting the surface of the shield 519 made of SUS 314 or SUS 316 to blast treatment using a blasting material of yttria ($Y_2O_3$), yttria ($Y_2O_3$) can be disposed on the surface of the shield 519.

The concentration of the small-amount material in the predetermined thin film can be controlled by changing film formation conditions such as the type and energy of ion particles, pressure at the time of film formation, the concentration of the predetermined small-amount material on the surface of the shield 519, the area and shape of the shield 519 exposed to a beam of ionized particles or the like, and a relative positional relationship between the shield 519 and the substrate 1. As described above, the concentration of the small-amount material in the predetermined thin film can be evaluated by measurement by TOF-SIMS using a ratio ($I_2/I_1$) of secondary ion intensity ($I_2$) of the small-amount material to secondary ion intensity ($I_1$) of the matrix material.

A method for forming the multilayer reflective film 5 using the ion beam sputtering apparatus 500 having the above configuration will be described.

First, the vacuum pump 511 is operated to discharge gas from an inside of the vacuum chamber 502 through the exhaust passage 510. Then, wait until the pressure in the vacuum chamber 502 measured by the pressure sensor 512 reaches a predetermined degree of vacuum (a degree of vacuum that does not affect the characteristics of a film to be formed, for example, $10^{-8}$ Torr ($1.33 \times 10^{-6}$ Pa)).

Next, the substrate 1, which is a substrate for forming a thin film, is introduced into the vacuum chamber 502 via a robot arm (not illustrated), and housed in an opening of the substrate holder 503 such that a main surface of the substrate 1 is exposed. Then, the substrate 1 disposed in the substrate holder 503 is clamped by holding a corner of the main surface of the substrate 1 with the holding pin 518 of the top clamp 517.

Note that an inside of a robot arm housing chamber (not illustrated) adjacent to the vacuum chamber 502 is also maintained in a predetermined vacuum state. Therefore, even when the substrate 1 is introduced into the vacuum chamber 502, the vacuum chamber 502 can be maintained in the above-described vacuum state.

Then, a plasma gas (for example, a plasma gas of krypton) is introduced into the vacuum chamber 502 from the plasma gas supply unit via the ion source 505. At this time, the degree of vacuum of the vacuum chamber 502 is controlled so as to be maintained at $10^{-4}$ to $10^{-2}$ Torr ($1.33 \times 10^{-2}$ to 1.33 Pa) suitable for performing sputtering.

Then, ionized particles (for example, $Kr^+$ particles) are supplied from the ion source 505 to the first sputtering target 507 disposed on the base 506. The particles are brought into collision with the first sputtering target 507, and the Si particles constituting the target 507 are released (sputtered) from a surface of the target 507, and the Si particles are attached to a main surface of the substrate 1. During this process, the neutralizer 513 is operated to neutralize the ionized particles ($Kr^+$ particles). In addition, during this process, the rod 504 of the substrate holder 503 and the rotation shaft 509 of the base 506 are controlled by a control device such that the rod 504 of the substrate holder 503 rotates at a predetermined rotation speed and an inclination angle of the first sputtering target 507 varies within a certain range. As a result, a Si film can be uniformly formed on the main surface of the substrate 1. Note that, at this time, a part of the surface of the shield 519 is exposed to the ionized particles. Therefore, a substance on the surface of the shield 519 is released, and a part of the substance is contained in the Si film as the small-amount material.

After the formation of the Si film is completed, the rotation shaft 509 of the base 506 is rotated by approximately 180° to cause the second sputtering target 508 to face the main surface of the substrate 1. Then, the ionized particles are supplied from the ion source 505 to the second sputtering target 508 disposed on the base 506. The Mo particles constituting the target 508 are released (sputtered) from a surface of the target 508 by the ionized particles, and the Mo particles are attached to a surface of the Si film formed on the main surface of the substrate 1. During this process, the neutralizer 513 is operated to neutralize the ionized particles (for example, $Kr^+$ particles). In addition, by controlling the rod 504 of the substrate holder 503 and the rotation shaft 509 similarly to the above-described Si film forming treatment, a Mo film can be formed with a uniform thickness on the Si film formed on the substrate 1. Note that, also at this time, a part of the surface of the shield 519 is exposed to the ionized particles similarly to the above-described Si film. Therefore, a substance on the surface of the shield 519 is released, and a part of the substance is contained in the Mo film as the small-amount material. By repeatedly performing the film forming treatment of a Si film and a Mo film a predetermined number of times (for example, 40 to 60 times), the multilayer reflective film 5 in which a Si film and a Mo film are alternately layered and which has a predetermined reflectance with respect to EUV light that is exposure light can be obtained.

As described above, by inclusion of the predetermined small-amount material in the predetermined thin film (for example, the multilayer reflective film 5) in a predetermined content range, it is possible to obtain the substrate with a thin film 120 (substrate with a multilayer reflective film 110) having the multilayer reflective film 5 that at least does not adversely affect the performance of the reflective mask 200.

As described above, the predetermined thin film of the substrate with a thin film 120 of the present embodiment is preferably at least one selected from the conductive back film 2, the multilayer reflective film 5, the protective film 6, the absorber film 7, and the etching mask film 9, and more preferably the multilayer reflective film 5 and/or the protective film 6. The small-amount material suitable for each of these thin films will be described in the following description.

<Substrate with a Multilayer Reflective Film 110>

The substrate 1 constituting the substrate with a multilayer reflective film 110, which is one type of the substrate with a thin film 120 of the present embodiment, and each thin film will be described.

<<Substrate 1>>

The substrate 1 in the substrate with a multilayer reflective film 110 of the present embodiment needs to prevent occurrence of distortion of an absorber pattern 7a due to heat during EUV exposure. Therefore, as the substrate 1, a substrate having a low thermal expansion coefficient within a range of 0±5 ppb/° C. is preferably used. As a material having a low thermal expansion coefficient within this range, for example, $SiO_2$—$TiO_2$-based glass, multicomponent-based glass ceramics, or the like can be used.

A first main surface on a side of the substrate 1 where a transfer pattern (formed by the absorber film 7 described later) is formed is subjected to surface treatment so as to have a predetermined flatness from a viewpoint of obtaining at least pattern transfer accuracy and position accuracy. In a case of EUV exposure, flatness in an area having a size of 132 mm×132 mm of the main surface on a side of the substrate 1 where a transfer pattern is formed is preferably 0.1 μm or less, more preferably 0.05 μm or less, and still more preferably 0.03 μm or less. In addition, a second main surface (back main surface) on a side opposite to the side where the absorber film 7 is formed is a surface to be electrostatically chucked when being set in an exposure apparatus. Flatness in an area having a size of 132 mm×132 mm of the second main surface is preferably 0.1 μm or less, more preferably 0.05 μm or less, and still more preferably 0.03 μm or less. Note that flatness in an area having a size of 142 mm×142 mm of the second main surface of the reflective mask blank 100 is preferably 1 μm or less, more preferably 0.5 μm or less, and still more preferably 0.3 μm or less.

In addition, high surface smoothness of the substrate 1 is also an extremely important item. Surface roughness of the first main surface on which the absorber pattern 7a for transfer is formed is preferably 0.15 nm or less, and more preferably 0.10 nm or less in terms of root mean square roughness (Rms). Note that the surface smoothness can be measured with an atomic force microscope.

Furthermore, the substrate 1 preferably has high rigidity in order to prevent deformation due to a film stress of a film (such as the multilayer reflective film 5) formed on the substrate 1. In particular, the substrate 1 preferably has a high Young's modulus of 65 GPa or more.

<<Base Film>>

The substrate with a multilayer reflective film 110 of the present embodiment can have a base film in contact with a surface of the substrate 1. The base film is a thin film formed between the substrate 1 and the multilayer reflective film 5. By inclusion of the base film, it is possible to prevent charge-up at the time of mask pattern defect inspection by an electron beam, to reduce phase defects of the multilayer reflective film 5, and to obtain high surface smoothness.

As a material of the base film, a material containing ruthenium or tantalum as a main component is preferably used. The material of the base film can be, for example, a Ru metal simple substance or a Ta metal simple substance. In addition, the material of the base film can be a Ru alloy or a Ta alloy containing Ru or Ta and a metal such as titanium (Ti), niobium (Nb), molybdenum (Mo), zirconium (Zr), yttrium (Y), boron (B), lanthanum (La), cobalt (Co), and/or rhenium (Re). The base film preferably has a film thickness of, for example, within a range of 1 nm to 10 nm.

In the present embodiment, the base film can be the predetermined thin film. That is, in a case where the base film is measured by time-of-flight secondary ion mass spectrometry (TOF-SIMS), when secondary ion intensity emitted from the base film is measured, a ratio ($I_2/I_1$) of secondary ion intensity ($I_2$) of at least one small-amount material in the thin film to secondary ion intensity ($I_1$) of the matrix material is preferably within the above-described predetermined range.

<<Multilayer Reflective Film 5>>

The substrate with a multilayer reflective film 110 (substrate with a thin film 120) of the present embodiment includes the multilayer reflective film 5. The multilayer reflective film 5 has a function of reflecting EUV light in the reflective mask 200. The multilayer reflective film 5 is a multilayer film in which layers mainly containing elements having different refractive indices are periodically layered. The substrate with a multilayer reflective film 110 including the multilayer reflective film 5 is one type of the substrate with a thin film 120 of the present embodiment. In the present embodiment, the multilayer reflective film 5 is preferably the predetermined thin film.

Generally, as the multilayer reflective film 5, a multilayer film is used in which a thin film (high refractive index layer) of a light element that is a high refractive index material or a compound of the light element and a thin film (low refractive index layer) of a heavy element that is a low refractive index material or a compound of the heavy element are alternately layered for about 40 to 60 periods.

The multilayer film used as the multilayer reflective film 5 may be formed by counting, as one period, a stack of a high refractive index layer and a low refractive index layer in which the high refractive index layer and the low refractive index layer are layered in this order from the substrate 1 side and building up the stack for a plurality of periods. Alternatively, the multilayer film may be formed by counting, as one period, a stack of a low refractive index layer and high refractive index layer in which the low refractive index layer and the high refractive index layer are layered in this order from the substrate 1 side and building up the stack for a plurality of periods. Note that a layer of the outermost surface of the multilayer reflective film 5, that is, a surface layer of the multilayer reflective film 5 on a side opposite to the substrate 1 is preferably the high refractive index layer. In the above-described multilayer film, when a stack of a high refractive index layer and a low refractive index layer in which the high refractive index layer and the low refractive index layer are layered in this order from the substrate 1 side is counted as one period and the stack is built up for a plurality of periods, the uppermost layer is the low refractive index layer. In this case, when the low refractive index layer constitutes the outermost surface of the multilayer reflective film 5, the low refractive index layer is easily oxidized and the reflectance of the reflective mask 200 is reduced. Therefore, it is preferable to further form the high refractive index layer on the low refractive index layer that is the uppermost layer to form the multilayer reflective film 5. Meanwhile, in the above-described multilayer film, when a stack of a low refractive index layer and a high refractive index layer in which the low refractive index layer and the high refractive index layer are layered in this order from the substrate 1 side is counted as one period and the stack is built up for a plurality of periods, the uppermost layer is the high refractive index layer. Therefore, in this case, it is not necessary to further form the high refractive index layer.

As the high refractive index layer, a layer containing silicon (Si) can be used. As a material containing Si, a Si compound containing Si and boron (B), carbon (C), nitrogen (N), oxygen (O), and/or hydrogen (H) can be used in addition to a Si simple substance. By using the high refractive index layer containing Si, the reflective mask 200 having an excellent reflectance with respect to EUV light can be obtained. In addition, as the low refractive index layer, a metal simple substance selected from molybdenum (Mo), ruthenium (Ru), rhodium (Rh), and platinum (Pt), or an alloy thereof can be used. In addition, to these metal simple substances or alloys, boron (B), carbon (C), nitrogen (N), oxygen (O), and/or hydrogen (H) may be added. In the substrate with a multilayer reflective film 110 of the present embodiment, the low refractive index layer is preferably a molybdenum (Mo) layer, and the high refractive index layer is preferably a silicon (Si) layer. For example, as the multilayer reflective film 5 for reflecting EUV light having a wavelength of 13 nm to 14 nm, a Mo/Si periodic layered film in which a Mo layer and a Si layer are alternately layered for about 40 to 60 periods is preferably used. Note that the high refractive index layer that is the uppermost layer of the multilayer reflective film 5 can be formed using silicon (Si), and a silicon oxide layer containing silicon and oxygen can be formed between the uppermost layer (Si) and the protective film 6. In the case of this structure, mask cleaning resistance can be improved.

A reflectance of the multilayer reflective film 5 alone is usually 65% or more, and an upper limit thereof is usually 73%. Note that the film thickness and period of each constituent layer of the multilayer reflective film 5 can be appropriately selected depending on an exposure wavelength. Specifically, the film thickness and period of each constituent layer of the multilayer reflective film 5 can be selected so as to satisfy the Bragg reflection law. In the multilayer reflective film 5, there are a plurality of high refractive index layers and a plurality of low refractive index layers, but the film thickness does not need to be the same between the high refractive index layers and between the low refractive index layers. In addition, the film thickness of the Si layer of the outermost surface of the multilayer reflective film 5 can be adjusted within a range that does not decrease the reflectance. The film thickness of the Si (high refractive index layer) of the outermost surface can be 3 nm to 10 nm.

In the present embodiment, the multilayer reflective film 5 of the substrate with a multilayer reflective film 110 is preferably the predetermined thin film. That is, in a case where the multilayer reflective film 5 is measured by time-of-flight secondary ion mass spectrometry (TOF-SIMS), when secondary ion intensity emitted from the multilayer reflective film 5 is measured, a ratio ($I_2/I_1$) of secondary ion intensity ($I_2$) of at least one small-amount material in the thin film to secondary ion intensity ($I_1$) of the matrix material is preferably within the above-described predetermined range.

When the multilayer reflective film 5 is the predetermined thin film, the matrix material can be molybdenum (Mo).

As described above, the multilayer reflective film 5 of the substrate with a multilayer reflective film 110 of the present embodiment is preferably the Mo/Si multilayer reflective film 5 having a low refractive index layer of a molybdenum (Mo) layer and a high refractive index layer of a silicon (Si) layer. When the Mo/Si multilayer reflective film 5 is measured by TOF-SIMS, the signal intensity of Mo is higher than the signal intensity of Si. Therefore, Mo is a material corresponding to the highest signal intensity when the Mo/Si multilayer reflective film 5 is measured by time-of-flight secondary ion mass spectrometry (TOF-SIMS). Therefore, the matrix material can be molybdenum (Mo).

The small-amount material contained in the multilayer reflective film 5 of the substrate with a multilayer reflective film 110 (substrate with a thin film 120) of the present embodiment preferably contains at least one element selected from yttrium (Y), zirconium (Zr), niobium (Nb), aluminum (Al), titanium (Ti), chromium (Cr), iron (Fe), nickel (Ni), and copper (Cu).

Extinction coefficients k of yttrium (Y), zirconium (Zr), and niobium (Nb) at a wavelength of 13.5 nm are relatively low. Therefore, when these small-amount materials are contained in the multilayer reflective film 5, an influence on the reflectance of the multilayer reflective film 5 with respect to EUV light is small. In addition, inclusion of these small-amount materials in the multilayer reflective film 5 may contribute to improvement in durability of the multilayer reflective film 5. In particular, when the small-amount material is yttrium (Y), etching resistance of the multilayer reflective film 5 is increased, which is preferable. Note that when such a material having a low extinction coefficient k is used as the small-amount material, the extinction coefficient k of the small-amount material is preferably less than 0.01, and more preferably 0.005 or less.

In addition, the extinction coefficients k of aluminum (Al), titanium (Ti), chromium (Cr), iron (Fe), nickel (Ni), and copper (Cu) at a wavelength of 13.5 nm are relatively high. However, when the content of the small-amount material contained in the multilayer reflective film 5 is a small amount (a secondary ion intensity ratio ($I_2/I_1$) is equal to or less than a predetermined value) as described above, an influence on the reflectance of the reflective mask 200 with respect to EUV light is small. In addition, inclusion of these small-amount materials may reduce a stress difference at an interface between the multilayer reflective film 5 and another thin film or the like. In addition, inclusion of these small-amount materials in the multilayer reflective film 5 tends to inhibit crystallization of the multilayer reflective film 5. Therefore, inclusion of these small-amount materials in the multilayer reflective film 5 can easily make the crystal structure of the multilayer reflective film 5 amorphous. Therefore, surface roughness of the multilayer reflective film 5 can be reduced.

In a case where the multilayer reflective film 5 is the Mo/Si multilayer reflective film 5 and at least one element selected from yttrium (Y), zirconium (Zr), and niobium (Nb) is contained as the small-amount material, when secondary ion intensity emitted from the multilayer reflective film 5 is measured, a ratio ($I_2/I_1$) of secondary ion intensity ($I_2$) of at least one small-amount material in the thin film to secondary ion intensity ($I_1$) of the matrix material (Mo) is preferably more than 0, more preferably 0.005 or more, and still more preferably 0.010 or more. In addition, the ratio ($I_2/I_1$) is preferably 0.300 or less, and more preferably 0.250 or less.

In a case where the multilayer reflective film 5 is the Mo/Si multilayer reflective film 5 and at least one element selected from aluminum (Al), titanium (Ti), chromium (Cr), iron (Fe), nickel (Ni), and copper (Cu) is contained as the small-amount material, when secondary ion intensity emitted from the multilayer reflective film 5 is measured, a ratio ($I_2/I_1$) of secondary ion intensity ($I_2$) of at least one small-amount material in the thin film to secondary ion intensity ($I_1$) of the matrix material (Mo) is preferably more than 0, and more preferably 0.005 or more. In addition, the ratio ($I_2/I_1$) is preferably 0.300 or less, and more preferably 0.250 or less.

When the substrate with a multilayer reflective film 110 of the present embodiment is manufactured, the multilayer reflective film 5 can be formed on the substrate 1 by an ion beam sputtering method. Using the above-described ion beam sputtering apparatus 500 as illustrated in FIG. 8, the multilayer reflective film 5 in which a high refractive index material and a low refractive index material are alternately layered can be formed. In this case, as a material constituting the first sputtering target 507, a high refractive index material such Si or a Si compound can be used. In addition, as a material constituting the second sputtering target 508, a low refractive index material such as Mo, Nb, Ru, or Rh can be used.

Here, a case where a Si material is used for the first sputtering target 507 and a Mo material is used for the second sputtering target 508 will be described. First, a Si layer having a film thickness of about 4 nm is formed on the substrate 1 using a Si target. Thereafter, a Mo layer having a film thickness of about 3 nm is formed using a Mo target. This stack of a Si layer and a Mo layer is counted as one period and the stack is build up for 40 to 60 periods to form the multilayer reflective film 5 (the layer of the outermost surface is a Si layer). Note that, in the case of 60 periods, the number of steps is larger than the number of steps in the case of 40 periods, but the reflectance with respect to EUV light can be increased.

As schematically illustrated in FIG. 8, the shield 519 is disposed in the vacuum chamber 502. For example, by using $Y_2O_3$, $ZrO_2$, and/or $Nb_2O_5$, or the like for the shield 519 or the like, the small-amount material incorporated into the multilayer reflective film 5 can be a material having a relatively low extinction coefficient k such as Y, Zr, or Nb. As a result, even when the small-amount material is contained in the multilayer reflective film 5, it is possible to reduce an influence on the reflectance of the multilayer reflective film 5 with respect to EUV light. In particular, when the shield 519 or the like is made of a material containing yttrium (Y), for example, $Y_2O_3$, Y is contained in the multilayer reflective film 5. Inclusion of yttrium (Y) as the small-amount material in the multilayer reflective film 5 increases etching resistance, which is preferable. As the shield 519 or the like made of a material containing yttrium (Y), for example, one obtained by spraying yttria ($Y_2O_3$) on the surface of the shield 519 made of SUS 314 or SUS 316 to form a coating film of yttria ($Y_2O_3$) on the surface of the shield 519 or the like can be used. In addition, by subjecting the surface of the shield 519 or the like to blast treatment using yttria ($Y_2O_3$) particles, yttria ($Y_2O_3$) can be disposed on the surface of the shield 519.

Note that when the multilayer reflective film 5 contains a small-amount material having a relatively high extinction coefficient k, such as Cr or Fe, the reflectance of the multilayer reflective film 5 may decrease. Stainless steel contains Cr and Fe. Therefore, when the shield 519 is made of stainless steel, there is a high possibility that Cr and Fe are contained as the small-amount material in the predetermined thin film. Therefore, it is preferable to prevent the content of the small-amount material such as Cr or Fe in the multilayer reflective film 5 from increasing by subjecting the shield 519 to surface treatment (coating film formation or blast treatment). However, when the small-amount material having a relatively high extinction coefficient k, such as Cr or Fe, is contained in an appropriate amount, the multilayer reflective film 5 is easily made amorphous. Therefore, surface roughness of the multilayer reflective film 5 can be reduced. In addition, when Al and/or Ti is selected as the small-amount material having a relatively high extinction coefficient k, $Al_2O_3$ and/or $TiO_2$ or the like can be used for the shield 519 or the like.

A method for forming the multilayer reflective film 5 using the ion beam sputtering apparatus 500 having the above configuration is as described as the method for forming the predetermined thin film.

As described above, when the Si film and the Mo film of the multilayer reflective film 5 are formed, a constituent member such as the shield 519 is exposed to a beam of ionized particles or the like. Therefore, it is difficult to prevent the formed multilayer reflective film 5 from containing a material (small-amount material) derived from a material inside the chamber such as the shield 519 in view of cost and production efficiency. Therefore, by controlling the multilayer reflective film 5 to contain the predetermined small-amount material in a predetermined content range, it is possible to obtain the substrate with a multilayer reflective film 110 (substrate with a thin film 120) having the multilayer reflective film 5 that at least does not adversely affect the performance of the reflective mask 200.

<<Protective Film 6>>

In the substrate with a multilayer reflective film 110 (substrate with a thin film 120) of the present embodiment, as illustrated in FIGS. 2 and 4, the protective film 6 is preferably formed on the multilayer reflective film 5. Formation of the protective film 6 on the multilayer reflective film 5 can suppress damage to a surface of the multilayer reflective film 5 when the reflective mask 200 is manufactured using the substrate with a multilayer reflective film 110. Therefore, a reflectance characteristic of the obtained reflective mask 200 with respect to EUV light is favorable. The substrate with a multilayer reflective film 110 including the protective film 6 is one type of the substrate with a thin film 120 of the present embodiment. In the present embodiment, the protective film 6 is preferably the predetermined thin film.

The protective film 6 is formed on the multilayer reflective film 5 in order to protect the multilayer reflective film 5 from dry etching and cleaning in a step of manufacturing the reflective mask 200 described later. In addition, the protective film 6 also has a function of protecting the multilayer reflective film 5 when a black defect of a mask pattern is repaired using an electron beam (EB).

FIGS. 2 and 4 illustrate a case where the protective film 6 has one layer. However, the protective film 6 may have a stack of three or more layers, the lowermost layer and the uppermost layer may be made of, for example, a substance containing ruthenium (Ru), and a metal other than Ru or an alloy may be interposed between the lowermost layer and the uppermost layer. The protective film 6 is made of, for example, a material containing ruthenium (Ru) as a main component. Examples of the material containing ruthenium as a main component include a Ru metal simple substance, a Ru alloy containing Ru and a metal such as titanium (Ti), niobium (Nb), molybdenum (Mo), zirconium (Zr), yttrium (Y), boron (B), lanthanum (La), cobalt (Co), rhenium (Re), and/or rhodium (Rh), and a material containing nitrogen in addition to the Ru metal simple substance or the Ru alloy. Among these materials, the protective film 6 made of a Ru-based material containing Ti is particularly preferably used. In this case, it is possible to suppress a phenomenon that silicon, which is a constituent element of the multilayer reflective film 5, diffuses from a surface of the multilayer reflective film 5 to the protective film 6. For this reason, surface roughness at the time of mask cleaning is reduced, and a film is less likely to be peeled off. Reduction of surface roughness is directly linked to prevention of a decrease in reflectance of the multilayer reflective film 5 with respect to EUV exposure light, and is therefore important for improving exposure efficiency of EUV exposure and improving throughput.

The Ru content ratio of a Ru alloy used for the protective film 6 is 50 atomic % or more and less than 100 atomic %, preferably 80 atomic % or more and less than 100 atomic %, and more preferably 95 atomic % or more and less than 100 atomic %. In particular, when the Ru content ratio of the Ru alloy is 95 atomic % or more and less than 100 atomic %, diffusion of an element (silicon) constituting the multilayer reflective film 5 to the protective film 6 can be suppressed. In addition, the protective film 6 in this case can have mask cleaning resistance, an etching stopper function when the absorber film 7 is etched, and a function of preventing the multilayer reflective film 5 from changing with time while sufficiently securing the reflectance with respect to EUV light.

In EUV lithography, since there are few substances that are transparent to exposure light, it is not technically easy to achieve an EUV pellicle that prevents foreign matters from being attached to a mask pattern surface. For this reason, pellicle-less operation without using a pellicle has been the mainstream. In addition, in the EUV lithography, exposure contamination such as carbon film deposition on the reflective mask 200 or oxide film growth due to EUV exposure occurs. Therefore, it is necessary to frequently clean the reflective mask 200 and remove foreign matters and contaminations on the reflective mask 200 at a stage where the reflective mask 200 is used for manufacturing a semiconductor device. For this reason, the reflective mask 200 for EUV exposure is required to have extraordinary mask cleaning resistance as compared with a transmissive mask for optical lithography. When the protective film 6 made of a Ru-based material containing Ti is used, cleaning resistance to a cleaning liquid such as sulfuric acid, sulfuric acid peroxide (SPM), ammonia, ammonia peroxide (APM), OH radical cleaning water, or ozone water having a concentration of 10 ppm or less is particularly high, and requirement for mask cleaning resistance can be satisfied.

The film thickness of the protective film 6 is not particularly limited as long as the function as the protective film 6 can be achieved. The film thickness of the protective film 6 is preferably 1.0 nm to 8.0 nm, and more preferably 1.5 nm to 6.0 nm from a viewpoint of the reflectance with respect to EUV light.

In the present embodiment, the protective film 6 of the substrate with a multilayer reflective film 110 is preferably the predetermined thin film. That is, in a case where the protective film 6 is measured by time-of-flight secondary ion mass spectrometry (TOF-SIMS), when secondary ion intensity emitted from the protective film 6 is measured, a ratio $(I_2/I_1)$ of secondary ion intensity $(I_2)$ of at least one small-amount material in the thin film to secondary ion intensity $(I_1)$ of the matrix material is preferably within the predetermined range described above.

In a case where the protective film 6 is a Ru metal simple substance or a Ru alloy containing Ru and a metal such as titanium (Ti), niobium (Nb), molybdenum (Mo), zirconium (Zr), yttrium (Y), boron (B), lanthanum (La), cobalt (Co), rhenium (Re), and/or rhodium (Rh), and at least one element selected from yttrium (Y), zirconium (Zr), and niobium (Nb) is contained as the small-amount material, when secondary ion intensity emitted from the protective film 6 is measured, a ratio ($I_2/I_1$) of secondary ion intensity ($I_2$) of at least one small-amount material in the thin film to secondary ion intensity ($I_1$) of the matrix material (Ru metal simple substance or Ru alloy) is preferably more than 0, more preferably 0.005 or more, and still more preferably 0.010 or more. In addition, the ratio ($I_2/I_1$) is preferably 0.300 or less, and more preferably 0.250 or less.

In a case where the protective film 6 is a Ru metal simple substance or a Ru alloy containing Ru and a metal such as titanium (Ti), niobium (Nb), molybdenum (Mo), zirconium (Zr), yttrium (Y), boron (B), lanthanum (La), cobalt (Co), rhenium (Re), and/or rhodium (Rh), and at least one element selected from aluminum (Al), titanium (Ti), chromium (Cr), iron (Fe), nickel (Ni), and copper (Cu) is contained as the small-amount material, when secondary ion intensity emitted from the protective film 6 is measured, a ratio ($I_2/I_1$) of secondary ion intensity ($I_2$) of at least one small-amount material in the thin film to secondary ion intensity ($I_1$) of the matrix material (Ru metal simple substance or Ru alloy) is preferably more than 0, and more preferably 0.005 or more. In addition, the ratio ($I_2/I_1$) is preferably 0.300 or less, and more preferably 0.250 or less.

As described above, the protective film 6 of the substrate with a multilayer reflective film 110 of the present embodiment is preferably made of a material containing ruthenium (Ru) as a main component. Therefore, when the protective film 6 is the predetermined thin film, the matrix material can be ruthenium (Ru).

The small-amount material contained in the protective film 6 of the substrate with a multilayer reflective film 110 (substrate with a thin film 120) of the present embodiment preferably contains at least one element selected from yttrium (Y), zirconium (Zr), niobium (Nb), aluminum (Al), titanium (Ti), chromium (Cr), iron (Fe), nickel (Ni), and copper (Cu).

Extinction coefficients k of yttrium (Y), zirconium (Zr), and niobium (Nb) at a wavelength of 13.5 nm are relatively low. Therefore, when these small-amount materials are contained in the protective film 6, an influence on transmission of EUV light to the multilayer reflective film 5 formed under the protective film 6 is small. In addition, inclusion of these small-amount materials in the protective film 6 may contribute to improvement in durability of the protective film 6. In particular, when the small-amount material is yttrium (Y), etching resistance of the protective film 6 is increased, which is preferable. Note that when such a material having a low extinction coefficient k is used as the small-amount material, the extinction coefficient k of the small-amount material is preferably less than 0.01, and more preferably 0.005 or less.

In addition, the extinction coefficients k of aluminum (Al), titanium (Ti), chromium (Cr), iron (Fe), nickel (Ni), and copper (Cu) at a wavelength of 13.5 nm are relatively high. However, when the content of the small-amount material contained in the protective film 6 is a small amount (the secondary ion intensity ratio ($I_2/I_1$) is equal to or less than a predetermined value) as described above, an influence on the reflectance of the reflective mask 200 with respect to EUV light is small. In addition, inclusion of these small-amount materials may reduce a stress difference at an interface between the protective film 6 and another thin film or the like. In addition, when these small-amount materials are contained in the protective film 6, crystallization of the protective film 6 tends to be inhibited. Therefore, inclusion of these small-amount materials in the protective film 6 can easily make the crystal structure of the protective film 6 amorphous. Therefore, surface roughness of the protective film 6 can be reduced.

As a method of forming the protective film 6, it is possible to adopt a known film forming method without any particular limitation. Specific examples of the method for forming the protective film 6 include a sputtering method and an ion beam sputtering method.

Similarly to the formation of the multilayer reflective film 5 described above, when the protective film 6 is formed, a constituent member disposed in a film forming apparatus, such as the shield 519, is exposed to a beam of ionized particles, plasma, or the like. Therefore, it is difficult to prevent the formed protective film 6 from containing a material (small-amount material) derived from a material inside the chamber such as the shield 519 in view of cost and production efficiency. Therefore, by controlling the protective film 6 to contain the predetermined small-amount material in a predetermined content range, it is possible to obtain the substrate with a multilayer reflective film 110 (substrate with a thin film 120) having the protective film 6 that does not adversely affect the performance of the reflective mask 200. For this purpose, a material of the constituent member disposed inside the chamber such as the shield 519 is preferably a material corresponding to the small-amount material.

<Reflective Mask Blank 100>

The reflective mask blank 100 of the present embodiment will be described. The reflective mask blank 100 includes the absorber film 7 on the above-described substrate with a multilayer reflective film 110. The reflective mask blank 100 including the absorber film 7 and the multilayer reflective film 5 and also including the protective film 6 as necessary is one type of the substrate with a thin film 120 of the present embodiment. In the reflective mask blank 100 of the present embodiment, the predetermined thin film is preferably at least one selected from the multilayer reflective film 5 and the protective film 6. In addition, the absorber film 7 can be the predetermined thin film.

<<Absorber Film 7>>

The absorber film 7 of the reflective mask blank 100 of the present embodiment is formed on the multilayer reflective film 5 (on the protective film 6 when the protective film 6 is formed). A basic function of the absorber film 7 is to absorb EUV light. The absorber film 7 can be the absorber film 7 intended to absorb EUV light. In addition, the absorber film 7 can be the absorber film 7 having a phase shift function in consideration of a phase difference of EUV light. The absorber film 7 having a phase shift function absorbs EUV light and reflects a part of the EUV light to shift a phase of the EUV light. That is, in the reflective mask 200 in which the absorber film 7 having a phase shift function is patterned, in a portion where the absorber film 7 is formed, a part of light is reflected at a level that does not adversely affect pattern transfer while EUV light is absorbed and attenuated. In addition, in a region (field portion) where the absorber film 7 is not formed, EUV light is reflected from the multilayer reflective film 5 via the protective film 6. Therefore, there is a desired phase difference between reflected light from the absorber film 7 having a phase shift function and reflected light from the field portion. The absorber film 7 having a phase shift function is formed such that a phase difference between reflected light from the absorber film 7 and reflected light from the multilayer reflective film 5 is 170 to 190 degrees. Beams of light having a reversed phase difference around 180 degrees interfere with each other at a pattern edge portion to improve an image contrast of a projected optical image. As the image contrast is improved, resolution is increased, and various exposure-related margins such as an exposure margin and a focus margin can be increased.

The absorber film 7 may be a single-layer film or a multilayer film including a plurality of films (for example, a lower absorber film and an upper absorber film). In a case of a single layer film, the number of steps at the time of manufacturing a mask blank can be reduced and production efficiency is increased. In a case of a multilayer film, the optical constant of an upper absorber film and the film thickness thereof can be appropriately set such that the upper absorber film serves as an antireflection film at the time of mask pattern defect inspection using light. This improves inspection sensitivity at the time of mask pattern defect inspection using light. In addition, when a film containing oxygen (O), nitrogen (N), and the like that improve oxidation resistance is used as the upper absorber film, temporal stability is improved. As described above, by forming the absorber film 7 into a multilayer film, various functions can be added to the absorber film 7. When the absorber film 7 is the absorber film 7 having a phase shift function, by forming the absorber film 7 into a multilayer film, a range of adjustment on an optical surface can be increased, and therefore a desired reflectance can be easily obtained.

A material of the absorber film 7 is not particularly limited as long as the material has a function of absorbing EUV light and can be processed by etching or the like (preferably, can be etched by dry etching with a chlorine (Cl) or fluorine (F)-based gas). As a material having such a function, at least one metal selected from palladium (Pd), silver (Ag), platinum (Pt), gold (Au), iridium (Ir), tungsten (W), chromium (Cr), cobalt (Co), manganese (Mn), tin (Sn), tantalum (Ta), vanadium (V), nickel (Ni), hafnium (Hf), iron (Fe), copper (Cu), tellurium (Te), zinc (Zn), magnesium (Mg), germanium (Ge), aluminum (Al), rhodium (Rh), ruthenium (Ru), molybdenum (Mo), niobium (Nb), titanium (Ti), zirconium (Zr), yttrium (Y), and silicon (Si), or a compound (alloy) thereof can be preferably used.

The absorber film 7 can be formed by a magnetron sputtering method such as a DC sputtering method or an RF sputtering method. For example, the absorber film 7 such as a tantalum compound can be formed by a reactive sputtering method using a target containing tantalum and boron and using an argon gas containing oxygen or nitrogen.

The tantalum compound for forming the absorber film 7 includes an alloy formed of Ta and the above-described metal. When the absorber film 7 is an alloy of Ta, the crystalline state of the absorber film 7 is preferably an amorphous or microcrystalline structure from a viewpoint of smoothness and flatness. If a surface of the absorber film 7 is not smooth or flat, the absorber pattern 7a may have a large edge roughness and a poor pattern dimensional accuracy. The absorber film 7 has a surface roughness of preferably 0.5 nm or less, more preferably 0.4 nm or less, still more preferably 0.3 nm or less in terms of root mean square roughness (Rms).

As the tantalum compound for forming the absorber film 7, a compound containing Ta and B, a compound containing Ta and N, a compound containing Ta, O, and N, a compound containing Ta and B and further containing at least either O or N, a compound containing Ta and Si, a compound containing Ta, Si, and N, a compound containing Ta and Ge, a compound containing Ta, Ge, and N, and the like can be used.

Ta is a material that has a large absorption coefficient of EUV light and can be easily dry-etched with a chlorine-based gas or a fluorine-based gas. Therefore, Ta can be said to be a material having excellent processability to be used for the absorber film 7. By further adding B, Si, and/or Ge, or the like to Ta, an amorphous material can be easily obtained. As a result, smoothness of the absorber film 7 can be improved. In addition, when N and/or O is added to Ta, resistance of the absorber film 7 to oxidation is improved, and therefore an effect of improving stability over time can be obtained.

In the reflective mask blank 100 of the present embodiment, the predetermined thin film is preferably at least one selected from the multilayer reflective film 5 and the protective film 6. In the reflective mask blank 100 of the present embodiment, the absorber film 7 is preferably further formed on the multilayer reflective film 5 or the protective film 6 which is the predetermined thin film. The matrix material and the small-amount material in the case where the predetermined thin film is the multilayer reflective film 5 and the protective film 6 are as described above.

In addition, in the reflective mask blank 100 of the present embodiment, the absorber film 7 can be the predetermined thin film. That is, in a case where the absorber film 7 is measured by time-of-flight secondary ion mass spectrometry (TOF-SIMS), when secondary ion intensity emitted from the absorber film 7 is measured, a ratio $(I_2/I_1)$ of secondary ion intensity $(I_2)$ of at least one small-amount material in the thin film to secondary ion intensity $(I_1)$ of the matrix material can be within the predetermined range described above.

In a case where a material of the absorber film 7 contains, as a main component, at least one element selected from palladium (Pd), silver (Ag), platinum (Pt), gold (Au), iridium (Ir), tungsten (W), chromium (Cr), cobalt (Co), manganese (Mn), tin (Sn), tantalum (Ta), vanadium (V), nickel (Ni), hafnium (Hf), iron (Fe), copper (Cu), tellurium (Te), zinc (Zn), magnesium (Mg), germanium (Ge), aluminum (Al), rhodium (Rh), ruthenium (Ru), molybdenum (Mo), niobium (Nb), titanium (Ti), zirconium (Zr), yttrium (Y), and silicon (Si), and aluminum (Al), titanium (Ti), chromium (Cr), iron (Fe), nickel (Ni), or copper (Cu) is contained as the small-amount material (excluding a combination of materials in which the material of the absorber film 7 and the small-amount material are the same), when secondary ion intensity emitted from the absorber film 7 is measured, a ratio $(I_2/I_1)$ of secondary ion intensity $(I_2)$ of at least one small-amount material in the thin film to secondary ion intensity $(I_1)$ of the matrix material is preferably more than 0 and more preferably 0.005 or more. In addition, the ratio $(I_2/I_1)$ is preferably 0.300 or less, more preferably 0.250 or less, and still more preferably 0.200 or less.

When the absorber film 7 is the predetermined thin film, the matrix material can be the above-described metal serving as the main component. The content ratio of the metal as the main component is preferably 50 atomic % or more.

For example, when the material of the absorber film 7 contains Ta, aluminum (Al), titanium (Ti), chromium (Cr), iron (Fe), nickel (Ni), or copper (Cu) is preferably contained as the small-amount material. An extinction coefficient k of aluminum (Al) or the like at a wavelength of 13.5 nm is relatively high. Therefore, when the absorber film 7 contains aluminum (Al) or the like as the small-amount material, the extinction coefficient k at a wavelength of 13.5 nm is relatively high. In addition, inclusion of aluminum (Al) or the like as the small-amount material may reduce a stress difference at an interface between the absorber film 7 and a thin film in contact with the absorber film 7 (for example, the multilayer reflective film 5, the protective film 6, or the like). For example, by blasting a surface of the shield 519 (for example, a stainless steel shield) disposed in the vacuum chamber 502 for forming the absorber film 7 with a blasting material of alumina ($Al_2O_3$), the absorber film 7 containing aluminum (Al) as the small-amount material can be obtained.

Preferably, the small-amount material contained in the absorber film 7 of the reflective mask blank 100 of the present embodiment does not contain yttrium (Y) or zirconium (Zr). Therefore, in order to form the absorber film 7, a constituent member such as the shield 519 disposed in the film forming apparatus is preferably made of a material not containing yttrium (Y) or zirconium (Zr).

<<Conductive Back Film 2>>

On a second main surface (back main surface) of the substrate 1 (on a side opposite to a surface on which the multilayer reflective film 5 is formed or on an intermediate layer such as a hydrogen intrusion suppressing film when the intermediate layer is formed on the substrate 1), the conductive back film 2 for an electrostatic chuck is formed. Sheet resistance required for the conductive back film 2 for an electrostatic chuck is usually 100Ω/□ (Ω/square) or less. A method for forming the conductive back film 2 is, for example, a magnetron sputtering method or an ion beam sputtering method using a target of a metal such as chromium or tantalum or an alloy thereof. A material containing chromium (Cr) for the conductive back film 2 is preferably a Cr compound containing Cr and at least one selected from boron, nitrogen, oxygen, and carbon. Examples of the Cr compound include CrN, CrON, CrCN, CrCON, CrBN, CrBON, CrBCN, CrBOCN, and the like. As a material containing tantalum (Ta) for the conductive back film 2, it is preferable to use Ta (tantalum), an alloy containing Ta, or a Ta compound containing either Ta or an alloy containing Ta and at least one selected from boron, nitrogen, oxygen, and carbon. Examples of the Ta compound include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, TaSiCON, and the like. The film thickness of the conductive back film 2 is not particularly limited as long as a function of the conductive back film 2 for an electrostatic chuck is satisfied, but is usually 10 nm to 200 nm. In addition, the conductive back film 2 further has a function of stress adjustment on the second main surface side of the mask blank 100. That is, the conductive back film 2 is adjusted such that the flat reflective mask blank 100 can be obtained in balance with a stress from various films formed on the first main surface side.

Note that before the above-described absorber film 7 is formed, the conductive back film 2 can be formed on the substrate with a multilayer reflective film 110. In this case, the substrate with a multilayer reflective film 110 including the conductive back film 2 as illustrated in FIG. 3 can be obtained.

Note that the conductive back film 2 can be the predetermined thin film. Therefore, the substrate with a thin film 120 (substrate with a conductive back film) as illustrated in FIG. 3 is also one type of the substrate with a thin film 120 of the present embodiment.

In a case where a material of the conductive back film 2 is a Cr compound or a Ta compound, and aluminum (Al), titanium (Ti), chromium (Cr), iron (Fe), nickel (Ni), or copper (Cu) is contained as the small-amount material, when secondary ion intensity emitted from the conductive back film 2 is measured, a ratio ($I_2/I_1$) of secondary ion intensity ($I_2$) of at least one small-amount material in the thin film to secondary ion intensity ($I_1$) of the matrix material (Ta or Cr) is preferably more than 0, and more preferably 0.005 or more. In addition, the ratio ($I_2/I_1$) is preferably 0.300 or less, and more preferably 0.250 or less.

When the conductive back film 2 is the predetermined thin film, the matrix material can be Ta or Cr. The content ratio of Ta or Cr is preferably 50 atomic % or more.

For example, when the material of the conductive back film 2 is a Ta compound, aluminum (Al), titanium (Ti), chromium (Cr), iron (Fe), nickel (Ni), or copper (Cu) is preferably contained as the small-amount material. Since electrical conductivity of aluminum (Al) or the like is high, inclusion of aluminum (Al) or the like as the small-amount material in the conductive back film 2 can contribute to conductivity of the conductive back film 2. In addition, the conductive back film 2 is required to have mechanical strength in order to perform a vacuum chuck. Inclusion of aluminum (Al) or the like as the small-amount material increases denseness of the film by amorphization, and can improve mechanical properties. For example, by blasting a surface of the shield 519 (for example, a stainless steel shield) disposed in the vacuum chamber 502 for forming the conductive back film 2 with a blasting material of alumina ($Al_2O_3$), the conductive back film 2 containing aluminum (Al) as the small-amount material can be obtained.

<Etching Mask Film 9>

The etching mask film 9 may be formed on the absorber film 7. As a material of the etching mask film 9, a material having a high etching selective ratio of the absorber film 7 to the etching mask film 9 is used. Here, the expression of "etching selective ratio of B to A" means a ratio of an etching rate of B that is a layer desired to be etched to an etching rate of A that is a layer is not desired to be etched (layer serving as a mask). Specifically, "etching selective ratio of B to A" is specified by a formula of "etching selective ratio of B to A=etching rate of B/etching rate of A". In addition, the expression "high selective ratio" means that a value of the selective ratio defined above is large as compared with that of an object for comparison. The etching selective ratio of the absorber film 7 to the etching mask film 9 is preferably 1.5 or more, and more preferably 3 or more.

Examples of a material having a high etching selective ratio of the absorber film 7 to the etching mask film 9 include a chromium material and a chromium compound material. When the absorber film 7 is etched with a fluorine-based gas, a chromium material and a chromium compound material can be used. Examples of the chromium compound include a material containing Cr and at least one element selected from N, O, C, and H. In addition, when the absorber film 7 is etched with a chlorine-based gas substantially containing no oxygen, a silicon material and a silicon compound material can be used. Examples of the silicon compound include a material containing Si and at least one element selected from N, O, C, and H and a material such as metallic silicon containing silicon or a silicon compound and a metal (metal silicide) or a metal silicon compound (metal silicide compound). Examples of the metal silicon compound include a material containing a metal, Si, and at least one element selected from N, O, C, and H.

The film thickness of the etching mask film 9 is desirably 3 nm or more from a viewpoint of obtaining a function as an etching mask for accurately forming a transfer pattern on the absorber film 7. In addition, the film thickness of the etching mask film 9 is desirably 15 nm or less from a viewpoint of reducing the film thickness of the resist film 8.

Note that the etching mask film 9 can be the above-described predetermined thin film.

<Other Thin Films>

The substrate with a thin film 120 of the present embodiment preferably includes a hydrogen intrusion suppressing film that suppresses intrusion of hydrogen from the substrate 1 into the conductive back film 2 between a glass substrate serving as the substrate 1 and the conductive back film 2 containing tantalum or chromium. The presence of the hydrogen intrusion suppressing film can suppress incorporation of hydrogen into the conductive back film 2, and can suppress an increase in compressive stress of the conductive back film 2.

Any type of material may be used as a material of the hydrogen intrusion suppressing film as long as the material hardly transmits hydrogen and can suppress intrusion of hydrogen from the substrate 1 into the conductive back film 2. Examples of the material of the hydrogen intrusion suppressing film include Si, $SiO_2$, SiON, SiCO, SiCON, SiBO, SiBON, Cr, CrN, CrON, CrC, CrCN, CrCO, CrCON, Mo, MoSi, MoSiN, MoSiO, MoSiCO, MoSiON, MoSiCON, TaO, TaON, and the like. The hydrogen intrusion suppressing film can be a single layer made of these materials, or may be a multilayer or a composition-gradient film.

Note that the hydrogen intrusion suppressing film can be the above-described predetermined thin film.

<Reflective Mask 200>

The present embodiment is the reflective mask 200 having, on the multilayer reflective film 5, the absorber pattern 7a obtained by patterning the absorber film 7 in the above-described reflective mask blank 100. By using the reflective mask blank 100 of the present embodiment, it is possible to obtain the reflective mask 200 that does not adversely affect the performance of the reflective mask 200 or improves the performance of the reflective mask 200.

The reflective mask 200 is manufactured using the reflective mask blank 100 of the present embodiment. Here, only an outline will be described, and a detailed description will be given below in Examples with reference to the drawings.

The reflective mask blank 100 is prepared, the resist film 8 is formed on the outermost surface of the first main surface thereof (on the absorber film 7 as described in Examples below) (this is unnecessary when the resist film 8 is included as the reflective mask blank 100), and a desired pattern such as a circuit pattern is drawn (exposed) on the resist film 8 and further developed and rinsed to form a predetermined resist pattern 8a.

Using the resist pattern 8a as a mask, the absorber film 7 is dry-etched to form the absorber pattern 7a. Note that, as an etching gas, a gas selected from a chlorine-based gas such as $Cl_2$, $SiCl_4$, or $CHCl_3$, a mixed gas containing a chlorine-based gas and $O_2$ at a predetermined ratio, a mixed gas containing a chlorine-based gas and He at a predetermined ratio, a mixed gas containing a chlorine-based gas and Ar at a predetermined ratio, a fluorine-based gas such as $CF_4$, $CHF_3$, $C_2F_6$, $C_3F_6$, $C_4F_6$, $C_4F_8$, $CH_2F_2$, $CH_3F$, $C_3F_8$, $SF_6$, or $F_2$, a mixed gas containing a fluorine-based gas and $O_2$ at a predetermined ratio, and the like can be used. Here, an etching gas containing oxygen in a final stage of etching causes surface roughness of the Ru-based protective film 6. For this reason, it is preferable to use an etching gas not containing oxygen in an over-etching stage in which the Ru-based protective film 6 is exposed to etching.

Thereafter, the resist pattern 8a is removed by ashing or with a resist stripping solution to prepare the absorber pattern 7a in which a desired circuit pattern is formed.

Through the above steps, the reflective mask 200 of the present embodiment can be obtained.

<Method for Manufacturing Semiconductor Device>

The present embodiment is a method for manufacturing a semiconductor device, the method including a step of performing a lithography process using an exposure apparatus using the above-described reflective mask 200 to form a transfer pattern on a transfer target object. Specifically, by setting the above-described reflective mask 200 in an exposure apparatus having an exposure light source that emits EUV light, a transfer pattern can be transferred to a resist film formed on a transfer target substrate. According to the method for manufacturing a semiconductor device of the present embodiment, since it is possible to use the reflective mask 200 that does not adversely affect the performance of the reflective mask 200 even if impurities (small-amount material) are contained in the thin film of the reflective mask 200, a semiconductor device having a fine and highly accurate transfer pattern can be manufactured.

Specifically, by performing EUV exposure using the above reflective mask 200 of the present embodiment, a desired transfer pattern can be formed on a semiconductor substrate. Through various steps such as etching of a film to be processed, formation of an insulating film or a conductive film, introduction of a dopant, and annealing in addition to this lithography process, it is possible to manufacture a semiconductor device in which a desired electronic circuit is formed at a high yield.

EXAMPLES

Hereinafter, Examples will be described with reference to the drawings.

Example 1

As Example 1, as illustrated in FIG. 2, the substrate with a multilayer reflective film 110 in which the multilayer reflective film 5 and the protective film 6 were formed on one main surface of the substrate 1 was prepared. The substrate with a multilayer reflective film 110 of Example 1 was prepared as follows.

A $SiO_2$—$TiO_2$-based glass substrate that is a low thermal expansion glass substrate having a 6025 size (approximately 152 mm×152 mm×6.35 mm) and having polished both main surfaces that are a first main surface and a second main surface was prepared as the substrate 1. The main surfaces were subjected to polishing including a rough polishing step, a precision polishing step, a local processing step, and a touch polishing step such that the main surfaces were flat and smooth.

The multilayer reflective film 5 and the protective film 6 were continuously formed on the first main surface of the above-described substrate 1 using the ion beam sputtering apparatus 500 as illustrated in FIG. 8.

Note that the shield 519 was disposed in the vacuum chamber 502 of the ion beam sputtering apparatus 500. As the shield 519, one obtained by subjecting a surface of the shield 519 made of SUS 314 to blast treatment was used. Yttria ($Y_2O_3$) particles were used as a blasting material. After the blast treatment, the shield 519 was cleaned by ultrasonic cleaning and/or plasma cleaning. By such blast treatment and cleaning treatment, yttria ($Y_2O_3$) could be disposed on a surface of the shield 519.

The multilayer reflective film 5 of Example 1 was the periodic multilayer reflective film 5 containing Si and Mo in order to make the multilayer reflective film 5 suitable for EUV light having a wavelength of 13.5 nm. Specifically, a Si target and a Mo target were used as a target of a high refractive index material and a target of a low refractive index material (first and second sputtering targets 507 and 508), respectively. Krypton (Kr) ion particles were supplied from an ion source 505 to these targets 507 and 508, and ion beam sputtering was performed to alternately build up a Si layer and a Mo layer on the substrate 1. Note that, during the ion beam sputtering, a substance contained in the shield 519, specifically, SUS 314 (chromium and iron) and a blasting material (yttrium) were contained as small-amount materials in the multilayer reflective film 5.

Here, sputtered particles of Si and Mo were made incident at an angle of 30 degrees with respect to a normal line of the main surfaces of the substrate 1. First, a Si layer was formed so as to have a film thickness of 4.2 nm, and then a Mo layer was formed so as to have a film thickness of 2.8 nm. This stack was counted as one period, the stack of a Si layer and a Mo layer was built up for 40 periods in a similar manner, and finally, a Si layer was formed so as to have a film thickness of 4.0 nm to form the multilayer reflective film 5. Therefore, a material of the lowermost layer of the multilayer reflective film 5, that is, a material of the multilayer reflective film 5 closest to the substrate 1 is Si, and a material of the uppermost layer of the multilayer reflective film 5, that is a material of the multilayer reflective film 5 in contact with the protective film 6 is also Si.

Next, after the formation of the multilayer reflective film 5, the protective film 6 was continuously formed on a surface of the above-described substrate with a multilayer reflective film 110. The protective film 6 containing Ru was formed so as to have a film thickness of 2.5 nm using a Ru target in an Ar gas atmosphere by an ion beam sputtering method. Here, sputtered Ru particles were made incident at an angle of 40 degrees with respect to a normal line of the main surfaces of the substrate 1. Note that during the ion beam sputtering, a substance contained in the shield 519, specifically, SUS 314 (chromium and iron) and a blasting material (yttrium) were contained in the protective film 6 as the small-amount materials. Thereafter, annealing at 130° C. was performed in the air.

The substrate with a multilayer reflective film 110 of Example 1 was manufactured as described above.

Next, portions corresponding to the protective film 6 and the multilayer reflective film 5 of the substrate with a multilayer reflective film 110 of Example 1 were measured by time-of-flight secondary ion mass spectrometry (TOF-SIMS). Specifically, a surface of the protective film 6 was ion-etched by 1 nm, and then the secondary ion intensities of the matrix material and the small-amount material were measured by TOF-SIMS of the protective film 6. Next, the protective film 6 was ion-etched to expose the multilayer reflective film 5 to a surface, and then the multilayer reflective film 5 was further etched by 1 nm. Thereafter, the secondary ion intensities of the matrix material and the small-amount material were measured by TOF-SIMS of the multilayer reflective film 5. Table 1 indicates the types of matrix material and small-amount material measured by TOF-SIMS. In Table 1, an element indicated as "*" (Y, Fe, and Cr) is a small-amount material to be measured. The matrix material of the protective film 6 was Ru, and the matrix material of the multilayer reflective film 5 was Mo. Measurement conditions of TOF-SIMS are indicated below.
  Primary ion species: $Bi_3^{++}$
  Primary acceleration voltage: 30 kV
  Primary ion current: 3.0 nA
  Primary ion irradiation region: square inner region of 200 μm on each side
  Secondary ion measurement range: 0.5 to 3000 m/z Table 2 indicates a ratio ($I_2/I_1$) of secondary ion intensity calculated from secondary ion intensity ($I_1$) of the matrix material (Ru) and secondary ion intensity ($I_2$) of the small-amount material by TOF-SIMS measurement of the protective film 6. In addition, Table 3 indicates a ratio ($I_2/I_1$) of secondary ion intensity calculated from secondary ion intensity ($I_1$) of the matrix material (Mo) and secondary ion intensity ($I_2$) of the small-amount material by TOF-SIMS measurement of the multilayer reflective film 5. Note that for example, "Y/Ru" in Table 2 means a ratio ($I_2/I_1$) between secondary ion intensity ($I_1$) of Ru as the matrix material and secondary ion intensity ($I_2$) of Y as the small-amount material. The same applies to Table 3 except that the matrix material is Mo.

The reflectance of the substrate with a multilayer reflective film 110 manufactured under the conditions of Example 1 with respect to EUV light having a wavelength of 13.5 nm was measured, and it was confirmed that there was no decrease in reflectance as compared with Reference Example described later. In addition, the crystallinity of the Mo film of the substrate with a multilayer reflective film 110 manufactured under the conditions of Example 1 was measured by an X-ray diffractometer (XRD), and it was confirmed that the Mo film was more microcrystalline as compared with Reference Example.

Examples 2 to 5

Table 1 indicates materials for manufacturing the substrates with a multilayer reflective film 110 of Examples 2 to 5. In Examples 2 to 5, similarly to Example 1, the substrate with a multilayer reflective film 110 in which the multilayer reflective film 5 and the protective film 6 were formed on the first main surface of the substrate 1 was manufactured. However, in Examples 2, 3, and 5, the shield 519 that had been subjected to blast treatment using particles of the materials indicated in Table 1 was used. Note that in Examples 3 and 5, the amounts of a shield material contained in the multilayer reflective film 5 and the protective film 6 were adjusted by adjusting the thickness for blast treatment. In addition, in Example 4, the shield 519 that had not been subjected to blast treatment was used. Therefore, the small-amount materials contained in the multilayer reflective film 5 and the protective film 6 of Examples 2 to 5 are different from those of Example 1.

Similarly to Example 1, portions corresponding to the protective film 6 and the multilayer reflective film 5 of the substrate with a multilayer reflective film 110 of Examples 2 to 5 were measured by time-of-flight secondary ion mass spectrometry (TOF-SIMS). Measurement results thereof are indicated in Tables 2 and 3. In addition, similarly to Example 1, the reflectance of the substrate with a multilayer reflective film 110 of Examples 2 to 5 and the crystallinity of the Mo film thereof were measured. As a result, similarly to Example 1, the substrate with a multilayer reflective film 110 of Examples 2 to 5 had no decrease in reflectance as compared with Reference Example, and was more microcrystalline as compared with Reference Example.

Examples 6 and 7

Table 1 indicates materials for manufacturing the substrate with a multilayer reflective film 110 of Examples 6 and 7. In Examples 6 and 7, similarly to Example 1, the substrate with a multilayer reflective film 110 in which the multilayer reflective film 5 and the protective film 6 were formed on the first main surface of the substrate 1 was manufactured.

However, in Examples 6 and 7, the protective film 6 was formed by a DC magnetron sputtering method.

In Example 6, similarly to Example 1, the multilayer reflective film 5 was formed by an ion beam sputtering method using the ion beam sputtering apparatus 500. Thereafter, the protective film 6 was formed by a DC magnetron sputtering method using a magnetron sputtering apparatus. Specifically, using a Ru target, the protective film 6 made of Ru was formed so as to have a film thickness of 2.5 nm on the multilayer reflective film 5 by a DC sputtering method in an Ar gas atmosphere. At this time, as shields in the ion beam sputtering apparatus 500 and the magnetron sputtering apparatus, those that had been subjected to blast treatment using particles of the material (alumina ($Al_2O_3$)) indicated in Table 1 were used. Therefore, aluminum (Al) was included as an element to be measured by time-of-flight secondary ion mass spectrometry (TOF-SIMS).

In Example 7, similarly to Example 6, the multilayer reflective film 5 was formed by an ion beam sputtering method using the ion beam sputtering apparatus 500. Thereafter, similarly to Example 6, the protective film 6 was formed by a DC magnetron sputtering method using a magnetron sputtering apparatus. In addition, in Example 7, a shield that had not been subjected to blast treatment was used in the ion beam sputtering apparatus 500 and a magnetron sputtering apparatus. In addition, in Example 7, a particle getter made of copper (Cu) was attached to a predetermined portion of an inner wall of each of the apparatuses, in particular, to the shield of each of the ion beam sputtering apparatus 500 and the magnetron sputtering apparatus to form the Mo/Si multilayer reflective film 5 and the protective film 6. Therefore, copper (Cu) was included as an element to be measured by time-of-flight secondary ion mass spectrometry (TOF-SIMS).

Similarly to Example 1, portions corresponding to the protective film 6 and the multilayer reflective film 5 of the substrate with a multilayer reflective film 110 of Examples 6 and 7 were measured by time-of-flight secondary ion mass spectrometry (TOF-SIMS). Measurement results thereof are indicated in Tables 2 and 3. In addition, similarly to Example 1, the reflectance of the substrate with a multilayer reflective film 110 of Example 6 and 7 and the crystallinity of the Mo film thereof were measured. As a result, similarly to Example 1, the substrate with a multilayer reflective film 110 of Examples 6 and 7 had no decrease in reflectance as compared with Reference Example, and was more microcrystalline as compared with Reference Example.

Reference Example 1

Similarly to Example 1, the substrate with a multilayer reflective film 110 of Reference Example 1 was manufactured. However, in Reference Example 1, a material of the shield 519 disposed in the vacuum chamber 502 of the ion beam sputtering apparatus 500 at the time of forming the multilayer reflective film 5 and the protective film 6 was high purity molybdenum (Mo). In addition, by cleaning a surface of the shield 519 by etching, impurities were prevented from being attached to the surface of the shield 519. Note that high purity molybdenum (Mo) is very expensive as compared with the shield 519 made of SUS 314. Therefore, cost for manufacturing the substrate with a multilayer reflective film 110 of Reference Example 1 is very high as compared with those in Examples 1 to 7.

Similarly to Example 1, portions corresponding to the protective film 6 and the multilayer reflective film 5 of the substrate with a multilayer reflective film 110 of Reference Example 1 were measured by time-of-flight secondary ion mass spectrometry (TOF-SIMS). In addition, similarly to Example 1, the reflectance of the substrate with a multilayer reflective film 110 of Reference Example 1 and the crystallinity of the Mo film thereof were measured. The multilayer reflective film 5 of Reference Example 1 contained no element corresponding to a small-amount material (at a level equal to or less than a detection limit), and the protective film 6 contained a small-amount material other than molybdenum (Mo) at a level equal to or less than a detection limit. Since the substrate with a multilayer reflective film 110 of Reference Example 1 had no problem as the substrate with a multilayer reflective film 110 for manufacturing the predetermined reflective mask 200, Reference Example 1 was used as one to be compared with Examples 1 to 7.

Note that the composition (atomic ratio) of the multilayer reflective film of Examples 1 to 7 and Reference Example 1 was measured by XPS, and found to be Mo:Si=40:60.

Evaluation Results of Substrates with a Multilayer Reflective Film 110 of Examples 1 to 7 and Reference Example 1

As indicated in Tables 2 and 3, in the portions corresponding to the protective film 6 and the multilayer reflective film 5 of each of the substrates with a multilayer reflective film 110 of Examples 1 to 7 and Reference Example 1, a secondary ion intensity ratio ($I_2/I_1$) calculated from secondary ion intensity ($I_1$) of the matrix material and secondary ion intensity ($I_2$) of the small-amount material by TOF-SIMS measurement was more than 0 and 0.300 or less.

In addition, it was confirmed that the reflectance of the multilayer reflective film 5 was not decreased as compared with that of Reference Example 1. In addition, as for the crystallinity of the Mo film, it was confirmed that the crystal grains were finer microcrystals as compared with that of Reference Example 1. Therefore, in Example 1 to 7, even if the predetermined thin film of the substrate with a multilayer reflective film 110 for manufacturing the reflective mask 200 contains impurities (small-amount material), it can be said that the impurities at least do not adversely affect the performance of the reflective mask 200 to be manufactured.

(Reflective Mask Blank 100)

The reflective mask blank 100 can be manufactured using each of the substrates with a multilayer reflective film 110 of Examples 1 to 7 and Reference Example 1 described above. Hereinafter, a method for manufacturing the reflective mask blank 100 will be described.

The absorber film 7 was formed on the protective film 6 of the substrate with a multilayer reflective film 110 by a DC magnetron sputtering method. The absorber film 7 was the absorber film 7 of a layered film including two layers of a TaN film as an absorption layer and a TaO film as a low reflection layer. On a surface of the protective film 6 of the substrate with a multilayer reflective film 110 described above, a TaN film was formed as an absorption layer by a DC magnetron sputtering method. The TaN film was formed by a reactive sputtering method in a mixed gas atmosphere of an Ar gas and a $N_2$ gas with the substrate with a multilayer reflective film 110 facing a Ta target. Next, a TaO film (low reflection layer) was further formed on the TaN film by a DC magnetron sputtering method. Similarly to the TaN film, this TaO film was formed by a reactive sputtering method in a mixed gas atmosphere of Ar and $O_2$ with the substrate with a multilayer reflective film 110 facing a Ta target.

The composition (atomic ratio) of the TaN film was Ta:N=70:30, and the film thickness thereof was 48 nm. In addition, the composition (atomic ratio) of the TaO film was Ta:O=35:65, and the film thickness thereof was 11 nm.

Next, the conductive back film 2 made of CrN was formed on the second main surface (back main surface) of the substrate 1 by a magnetron sputtering method (reactive sputtering) method under the following conditions. Conditions for forming the conductive back film 2: a Cr target, a mixed gas atmosphere of Ar and $N_2$ (Ar: 90 atomic %, N: 10 atomic %), and a film thickness of 20 nm.

As described above, the reflective mask blank 100 was manufactured using each of the substrates with a multilayer reflective film 110 of Examples 1 to 7 and Reference Example 1.

(Reflective Mask 200)

Next, using each of the above reflective mask blanks 100 of Examples 1 to 7 and Reference Example 1, the reflective mask 200 was manufactured. The manufacture of the reflective mask 200 will be described with reference to FIGS. 7A to 7E.

Figure 7A:
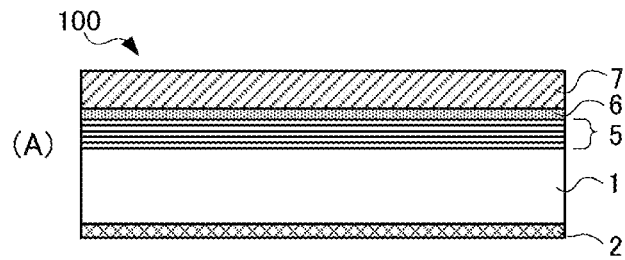
FIGS. 7A to 7E are process diagrams illustrating a method for manufacturing a reflective mask of the present embodiment in schematic cross-sectional views.
Figure 7B:
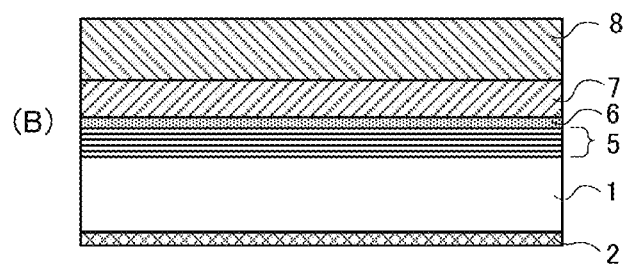
Figure 7C:
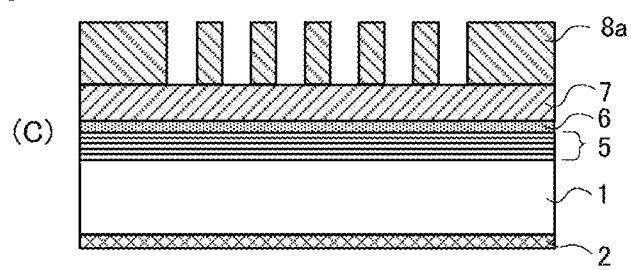
Figure 7D:
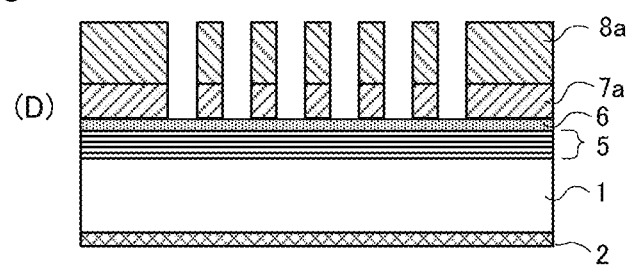
Figure 7E:
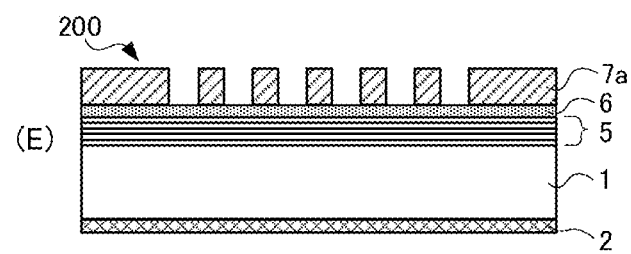

First, as illustrated in FIG. 7B, the resist film 8 was formed on the absorber film 7 of the reflective mask blank 100. Then, a desired pattern such as a circuit pattern was drawn (exposed) on the resist film 8 and further developed and rinsed to form the predetermined resist pattern 8a. (FIG. 7C). Next, using the resist pattern 8a as a mask, the TaO film (upper absorber film) was dry-etched using a $CF_4$ gas, and subsequently the TaN film (lower absorber film) was dry-etched using a $Cl_2$ gas to form the absorber pattern 7a (FIG. 7D). The protective film 6 made of Ru has extremely high dry etching resistance to a $Cl_2$ gas, and serves as a sufficient etching stopper. Thereafter, the resist pattern 8a was removed, for example, by ashing or with a resist stripping solution (FIG. 7E).

As described above, the reflective masks 200 of Examples 1 to 7 and Reference Example 1 were manufactured.

(Manufacture of Semiconductor Device)

The reflective mask 200 manufactured using each of the substrates with a multilayer reflective film 110 of Examples 1 to 7 and Reference Example 1 was set in an EUV scanner, and EUV exposure was performed on a wafer on which a film to be processed and a resist film were formed on a semiconductor substrate. Then, this resist film that had been subjected to exposure was developed to form a resist pattern on the semiconductor substrate on which the film to be processed was formed.

The reflective mask 200 manufactured using each of the substrates with a multilayer reflective film 110 of Examples 1 to 7 at least did not adversely affect the performance of the reflective mask 200 even if impurities are contained in the thin film constituting the reflective mask 200. Therefore, a fine and highly accurate transfer pattern could be formed similarly to Reference Example 1.

This resist pattern was transferred to a film to be processed by etching, and through various steps such as formation of an insulating film or a conductive film, introduction of a dopant, and annealing, a semiconductor device having desired characteristics could be manufactured at a high yield.

TABLE 1

| | Material | | | | *: Type of element of small-amount material measured by TOF-SIMS | | | | | | | |
|---|---|---|---|---|---|---|---|---|---|---|---|---|
| | Multilayer reflective film | Protective film | Shield material | Blast treatment material | Y | Fe | Cr | Zr | Nb | Ni | Ti | Al | Cu |
| Example 1 | Mo/Si | Ru | SUS314 | $Y_2O_3$ | * | * | * | | | | | | |
| Example 2 | Mo/Si | Ru | SUS314 | $ZrO_2$ | | * | * | * | | | | | |
| Example 3 | Mo/Si | Ru | SUS314 | $Nb_2O_5$ | | * | | | * | | | | |
| Example 4 | Mo/Si | Ru | SUS314 | none | | * | * | | | * | | | |
| Example 5 | Mo/Si | Ru | SUS314 | $TiO_3$ | | | | | | | * | | |
| Example 6 | Mo/Si | Ru | SUS314 | $Al_2O_3$ | | | | | | | | * | |
| Example 7 | Mo/Si | Ru | SUS314 | none | | * | * | | | | | | * |

TABLE 2

| | Y/Ru | Fe/Ru | Cr/Ru | Zr/Ru | Nb/Ru | Ni/Ru | Ti/Ru | Al/Ru | Cu/Ru |
|---|---|---|---|---|---|---|---|---|---|
| Example 1 | 0.200 | 0.010 | 0.010 | | | | | | |
| Example 2 | | 0.010 | 0.010 | 0.200 | | | | | |
| Example 3 | | 0.010 | | | 0.200 | | | | |
| Example 4 | | 0.080 | 0.030 | | | 0.060 | | | |
| Example 5 | | | | | | | 0.200 | | |
| Example 6 | | | | | | | | 0.267 | |
| Example 7 | | 0.080 | 0.030 | | | | | | 0.100 |

TABLE 3

| | Y/Mo | Fe/Mo | Cr/Mo | Zr/Mo | Nb/Mo | Ni/Mo | Ti/Mo | Al/Mo | Cu/Mo |
|---|---|---|---|---|---|---|---|---|---|
| Example 1 | 0.200 | 0.075 | 0.075 | | | | | | |
| Example 2 | | 0.075 | 0.075 | 0.180 | | | | | |

TABLE 3-continued

| | Y/Mo | Fe/Mo | Cr/Mo | Zr/Mo | Nb/Mo | Ni/Mo | Ti/Mo | Al/Mo | Cu/Mo |
|---|---|---|---|---|---|---|---|---|---|
| Example 3 | 0.075 | | | | 0.160 | | | | |
| Example 4 | | 0.075 | 0.075 | | | 0.120 | | | |
| Example 5 | | | | | | | 0.180 | | |
| Example 6 | | | | | | | | 0.010 | |
| Example 7 | | 0.075 | 0.075 | | | | | | 0.080 |

REFERENCE SIGNS LIST

1 Mask blank substrate (substrate)
2 Conductive back film
5 Multilayer reflective film
6 Protective film
7 Absorber film
7a Absorber pattern
8 Resist film
8a Resist pattern
9 Etching mask film
100 Reflective mask blank
110 Substrate with a multilayer reflective film
120 Substrate with a thin film
200 Reflective mask
500 Ion beam sputtering apparatus
502 Vacuum chamber
503 Substrate holder
504 Holder attaching rod
505 Ion source
506 Base
507 First sputtering target
508 Second sputtering target
509 Rotation shaft
510 Exhaust passage
511 Vacuum pump
512 Pressure sensor
513 Neutralizer
517 Top clamp
518 Holding pin
519 Shield

The invention claimed is:

1. A substrate with a thin film comprising:
a substrate; and
at least one thin film formed on a main surface of the substrate, wherein
the thin film comprises a matrix material constituting the thin film and a small-amount material other than the matrix material, and
a ratio ($I_2/I_1$) of secondary ion intensity ($I_2$) of the small-amount material in the thin film to secondary ion intensity ($I_1$) of the matrix material, as measured by time-of-flight secondary ion mass spectrometry (TOF-SIMS) analysis of the thin film, is more than 0 and not more than 0.300.

2. The substrate with a thin film according to claim 1, wherein the small-amount material comprises at least one element selected from yttrium (Y), zirconium (Zr), niobium (Nb), aluminum (Al), titanium (Ti), chromium (Cr), iron (Fe), nickel (Ni), and copper (Cu).

3. The substrate with a thin film according to claim 1, wherein the thin film is at least one selected from a conductive back film, a multilayer reflective film, a protective film, an absorber film, and an etching mask film.

4. The substrate with a thin film according to claim 3, wherein the thin film is a multilayer reflective film, and the matrix material is molybdenum (Mo).

5. The substrate with a thin film according to claim 3, wherein the thin film is a protective film, and the matrix material is ruthenium (Ru).

6. A reflective mask blank comprising:
a substrate; and
at least one thin film formed on a main surface of the substrate, wherein:
the thin film is at least one selected from a multilayer reflective film and a protective film;
an absorber film is on the multilayer reflective film or the protective film;
the thin film comprises a matrix material constituting the thin film and a small-amount material other than the matrix material; and
a ratio ($I_2/I_1$) of secondary ion intensity ($I_2$) of the small-amount material in the thin film to secondary ion intensity ($I_1$) of the matrix material, as measured by time-of-flight secondary ion mass spectrometry (TOF-SIMS) analysis of the thin film, is more than 0 and not more than 0.300.

7. A reflective mask comprising:
a substrate; and
at least one thin film formed on a main surface of the substrate, wherein:
the thin film is at least one selected from a multilayer reflective film and a protective film;
an absorber pattern is on the multilayer reflective film or the protective film;
the thin film comprises a matrix material constituting the thin film and a small-amount material other than the matrix material; and
a ratio ($I_2/I_1$) of secondary ion intensity ($I_2$) of the small-amount material in the thin film to secondary ion intensity ($I_1$) of the matrix material, as measured by time-of-flight secondary ion mass spectrometry (TOF-SIMS) analysis of the thin film, is more than 0 and not more than 0.300.

8. A method for manufacturing a semiconductor device, the method comprising setting the reflective mask according to claim 7 in an exposure apparatus having an exposure light source that emits EUV light and transferring a transfer pattern to a resist film formed on a transfer target substrate.

9. The reflective mask blank according to claim 6, wherein the small-amount material comprises at least one element selected from yttrium (Y), zirconium (Zr), niobium (Nb), aluminum (Al), titanium (Ti), chromium (Cr), iron (Fe), nickel (Ni), and copper (Cu).

10. The reflective mask blank according to claim 6, wherein the thin film is the multilayer reflective film, and the matrix material is molybdenum (Mo).

11. The reflective mask blank according to claim 6, wherein the thin film is the protective film, and the matrix material is ruthenium (Ru).

12. The reflective mask according to claim 7, wherein the small-amount material comprises at least one element selected from yttrium (Y), zirconium (Zr), niobium (Nb), aluminum (Al), titanium (Ti), chromium (Cr), iron (Fe), nickel (Ni), and copper (Cu).

13. The reflective mask according to claim 7, wherein the thin film is the multilayer reflective film, and the matrix material is molybdenum (Mo).

14. The reflective mask according to claim 7, wherein the thin film is the protective film, and the matrix material is ruthenium (Ru).

\* \* \* \* \*